(12) United States Patent
Kim et al.

(10) Patent No.: US 11,694,936 B2
(45) Date of Patent: Jul. 4, 2023

(54) SEMICONDUCTOR PACKAGE AND METHOD OF FABRICATING THE SAME

(71) Applicant: Samsung Electronics Co., Ltd., Suwon-si (KR)

(72) Inventors: Minjung Kim, Cheonan-si (KR); Kyoung Lim Suk, Suwon-si (KR); Seokhyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 129 days.

(21) Appl. No.: 17/235,997

(22) Filed: Apr. 21, 2021

(65) Prior Publication Data

US 2022/0077007 A1 Mar. 10, 2022

(30) Foreign Application Priority Data

Sep. 9, 2020 (KR) ........................ 10-2020-0115598

(51) Int. Cl.
*H01L 21/683* (2006.01)
*H01L 21/66* (2006.01)
(Continued)

(52) U.S. Cl.
CPC .......... *H01L 22/32* (2013.01); *H01L 21/4853* (2013.01); *H01L 21/4857* (2013.01);
(Continued)

(58) Field of Classification Search
CPC . H01L 22/32; H01L 21/4853; H01L 21/4857; H01L 21/565; H01L 21/568; H01L 21/6835; H01L 22/12; H01L 23/3128; H01L 23/49822; H01L 23/49838; H01L 24/16; H01L 2221/6835; H01L 2224/16227; H01L 23/3675; H01L 23/49816; H01L 23/5383; H01L 23/5385; H01L 23/5389; H01L 24/08; H01L 24/13; H01L 24/19; H01L 24/20; H01L 24/29; H01L 24/32; H01L 24/73; H01L 24/92; H01L 25/105; H01L 2224/08225; H01L 2224/08235; H01L 2224/13101; H01L 2224/13111; H01L 2224/13116;
(Continued)

(56) References Cited

U.S. PATENT DOCUMENTS 5,258,648 A    11/1993  Lin
6,251,724 B1 *  6/2001  Ku ...................... H01L 27/0629
                                                        438/763

(Continued)

FOREIGN PATENT DOCUMENTS

KR         100799161 B1    1/2008

*Primary Examiner* — Vu A Vu
(74) *Attorney, Agent, or Firm* — Muir Patent Law, PLLC

(57) ABSTRACT

Disclosed are semiconductor packages and methods of fabricating the same. The semiconductor package includes a redistribution substrate that includes a chip region and an edge region around the chip region, and a semiconductor chip on the chip region of the redistribution substrate. The redistribution substrate includes a plurality of dielectric layers that are vertically stacked, a plurality of redistribution patterns on the chip region and in each of the dielectric layers, and a redistribution test pattern on the edge region and at a level the same as a level of at least one of the redistribution patterns.

20 Claims, 22 Drawing Sheets

(51) Int. Cl.
*H01L 23/31* (2006.01)
*H01L 23/498* (2006.01)
*H01L 23/00* (2006.01)
*H01L 21/48* (2006.01)
*H01L 21/56* (2006.01)

(52) U.S. Cl.
CPC .......... *H01L 21/565* (2013.01); *H01L 21/568* (2013.01); *H01L 21/6835* (2013.01); *H01L 22/12* (2013.01); *H01L 23/3128* (2013.01); *H01L 23/49822* (2013.01); *H01L 23/49838* (2013.01); *H01L 24/16* (2013.01); *H01L 2221/6835* (2013.01); *H01L 2224/16227* (2013.01)

(58) Field of Classification Search
CPC . H01L 2224/13147; H01L 2224/16145; H01L 2224/16146; H01L 2224/2929; H01L 2224/2939; H01L 2224/32145; H01L 2224/32225; H01L 2224/73204; H01L 2224/73253; H01L 2224/81801; H01L 2224/83862; H01L 2224/83871; H01L 2224/97; H01L 2924/14; H01L 2924/1431; H01L 2924/1434; H01L 2924/15174; H01L 2924/15192; H01L 2924/15311; H01L 2924/16152; H01L 2924/18161; H01L 24/97; H01L 2224/16225; H01L 2224/16235; H01L 2224/92125; H01L 2924/181; H01L 23/32; H01L 21/76; H01L 23/31; H01L 23/367; H01L 23/485; H01L 23/50; H01L 23/525; H01L 25/0657
USPC .......................................................... 257/48
See application file for complete search history.

(56) References Cited

U.S. PATENT DOCUMENTS

| | | | |
|---|---|---|---|
| 6,673,653 B2 | 1/2004 | Pierce | |
| 6,825,678 B2 | 11/2004 | Kline | |
| 7,649,368 B2 | 1/2010 | Eldridge et al. | |
| 7,663,206 B2 | 2/2010 | Lee | |
| 7,679,384 B2 * | 3/2010 | Chen | H01L 22/34 |
| | | | 324/755.11 |
| 7,746,086 B2 | 6/2010 | Eun et al. | |
| 8,237,160 B2 * | 8/2012 | Chen | H01L 27/0203 |
| | | | 257/48 |
| 8,664,540 B2 | 3/2014 | Lu et al. | |
| 9,276,166 B2 * | 3/2016 | Hsu | H01L 33/0095 |
| 9,601,443 B2 * | 3/2017 | Tsai | H01L 23/585 |
| 9,704,766 B2 | 7/2017 | Goel et al. | |
| 10,043,722 B2 * | 8/2018 | Roberts, Jr. | H01L 23/544 |
| 10,163,771 B2 | 12/2018 | Zuo et al. | |
| 10,163,876 B2 | 12/2018 | Jeng et al. | |
| 11,094,644 B2 * | 8/2021 | Salinas | G03F 7/70125 |
| 11,244,939 B2 * | 2/2022 | Tsai | H01L 25/50 |
| 2012/0034714 A1 * | 2/2012 | Tsai | H01L 33/0095 |
| | | | 257/E21.531 |
| 2019/0096875 A1 * | 3/2019 | Roh | H01L 23/5226 |
| 2019/0341360 A1 | 11/2019 | Yu et al. | |
| 2020/0027750 A1 | 1/2020 | Wei et al. | |
| 2020/0091100 A1 * | 3/2020 | Han | H01L 21/67253 |

* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2020-0115598, filed on Sep. 9, 2020, in the Korean Intellectual Property Office, the disclosure of which is hereby incorporated by reference in its entirety.

BACKGROUND

The present inventive concepts relate to a semiconductor package and a method of fabricating the same, and more particularly, to a semiconductor package including a redistribution substrate and a method of fabricating the same.

Portable devices have been increasingly demanded in recent electronic product markets, and as a result, it has been continuously required for reduction in size and weight of electronic parts mounted on the portable devices. To accomplish the reduction in size and weight of the electronic parts, there is need for technology not only to reduce each size of mounting parts, but to integrate a number of individual devices on a single package.

SUMMARY

Some example embodiments of the present inventive concepts provide a semiconductor package with increased reliability and a method of fabricating the same.

An object of the present inventive concepts is not limited to the mentioned above, and other objects which have not been mentioned above will be clearly understood to those skilled in the art from the following description.

According to example embodiments of the present inventive concepts, a semiconductor package may include: a redistribution substrate that includes a chip region and an edge region around the chip region; and a semiconductor chip on the chip region of the redistribution substrate. The redistribution substrate may include: a plurality of dielectric layers that are vertically stacked; a plurality of redistribution patterns on the chip region and in each of the dielectric layers; and a redistribution test pattern on the edge region and at a level the same as a level of at least one of the redistribution patterns.

According to example embodiments of the present inventive concepts, a semiconductor package may include: a package substrate; a redistribution substrate on the package substrate, the redistribution substrate having a chip region and an edge region around the chip region; a first semiconductor chip on the chip region of the redistribution substrate; a second semiconductor chip on the chip region of the redistribution substrate and spaced apart from the first semiconductor chip, the second semiconductor chip including a plurality of memory chips that are vertically stacked; a molding layer on the redistribution substrate, the molding layer covering the first semiconductor chip and the second semiconductor chip; a plurality of first connection terminals between the redistribution substrate and the first semiconductor chip and between the redistribution substrate and the second semiconductor chip; a plurality of second connection terminals between the package substrate and the redistribution substrate; and a thermal radiation structure on the package substrate, the thermal radiation structure covering the redistribution substrate, the first semiconductor chip, and the second semiconductor chip. The redistribution substrate may include: a plurality of dielectric layers that are vertically stacked; a plurality of first redistribution patterns on the chip region and in each of the dielectric layers; and a second redistribution pattern on the edge region and in at least one of the dielectric layers, the second redistribution pattern having a sidewall vertically aligned with sidewalls of the dielectric layers.

According to example embodiments of the present inventive concepts, a method of fabricating a semiconductor package may include: providing a carrier substrate that includes a plurality of chip regions and a scribe line region between the chip regions; forming a redistribution substrate that includes a plurality of redistribution layers vertically stacked on the carrier substrate, each of the redistribution layers including a dielectric layer and a plurality of redistribution patterns; mounting a semiconductor chip on the redistribution substrate; forming a molding layer that covers the semiconductor chip; and cutting the molding layer and the redistribution substrate along the scribe line region. At least one of the redistribution layers may include: a plurality of redistribution test patterns on the chip region; and a plurality of test pads connected to the redistribution test patterns and on the scribe line region. The step of forming the redistribution substrate may include performing a test process on at least one of the redistribution layers via the test pads.

DETAILED DESCRIPTION OF EMBODIMENTS

The following will now describe a semiconductor package and a method of fabricating the same, according to some example embodiments of the present inventive concepts in conjunction with the accompanying drawings. Herein, like numerals refer to like elements throughout. As used herein, terms such as "same," "equal," "planar," or "coplanar," when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Figure 1:
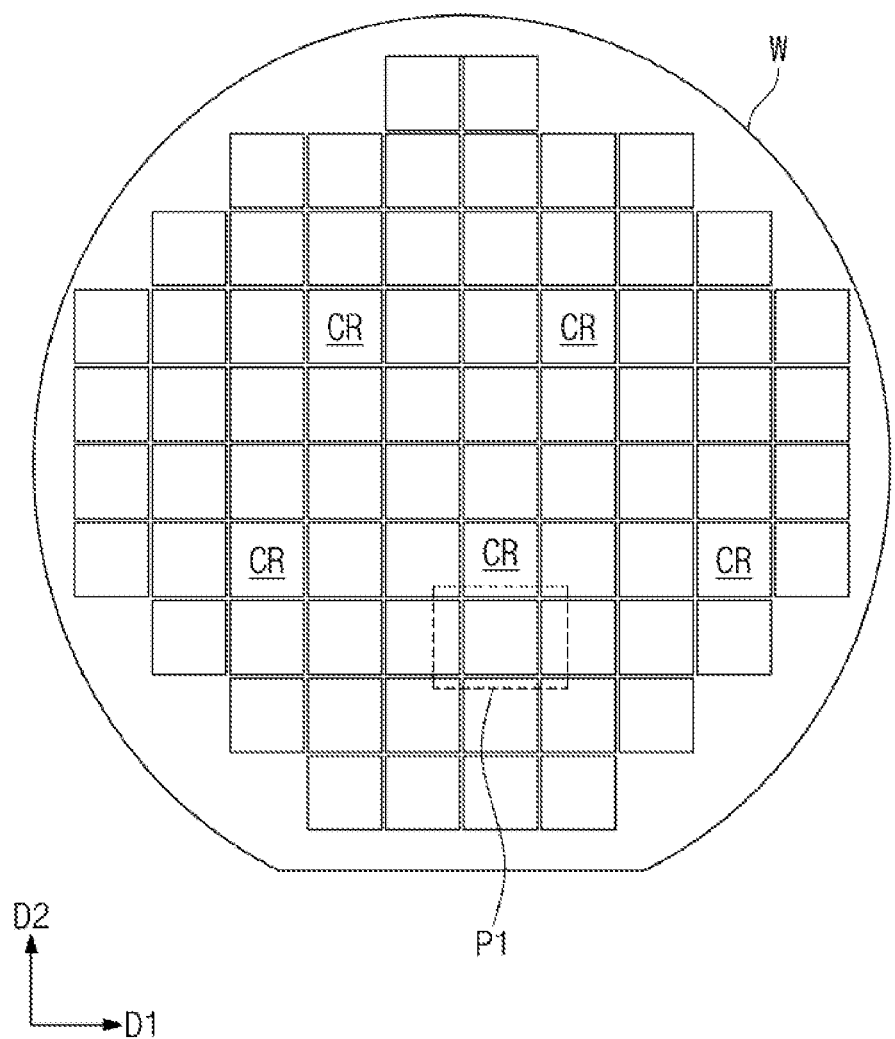
FIG. 1 illustrates a plan view showing a substrate that includes a redistribution layer used for fabricating a semiconductor package, according to some example embodiments of the present inventive concepts.
Figure 2A:
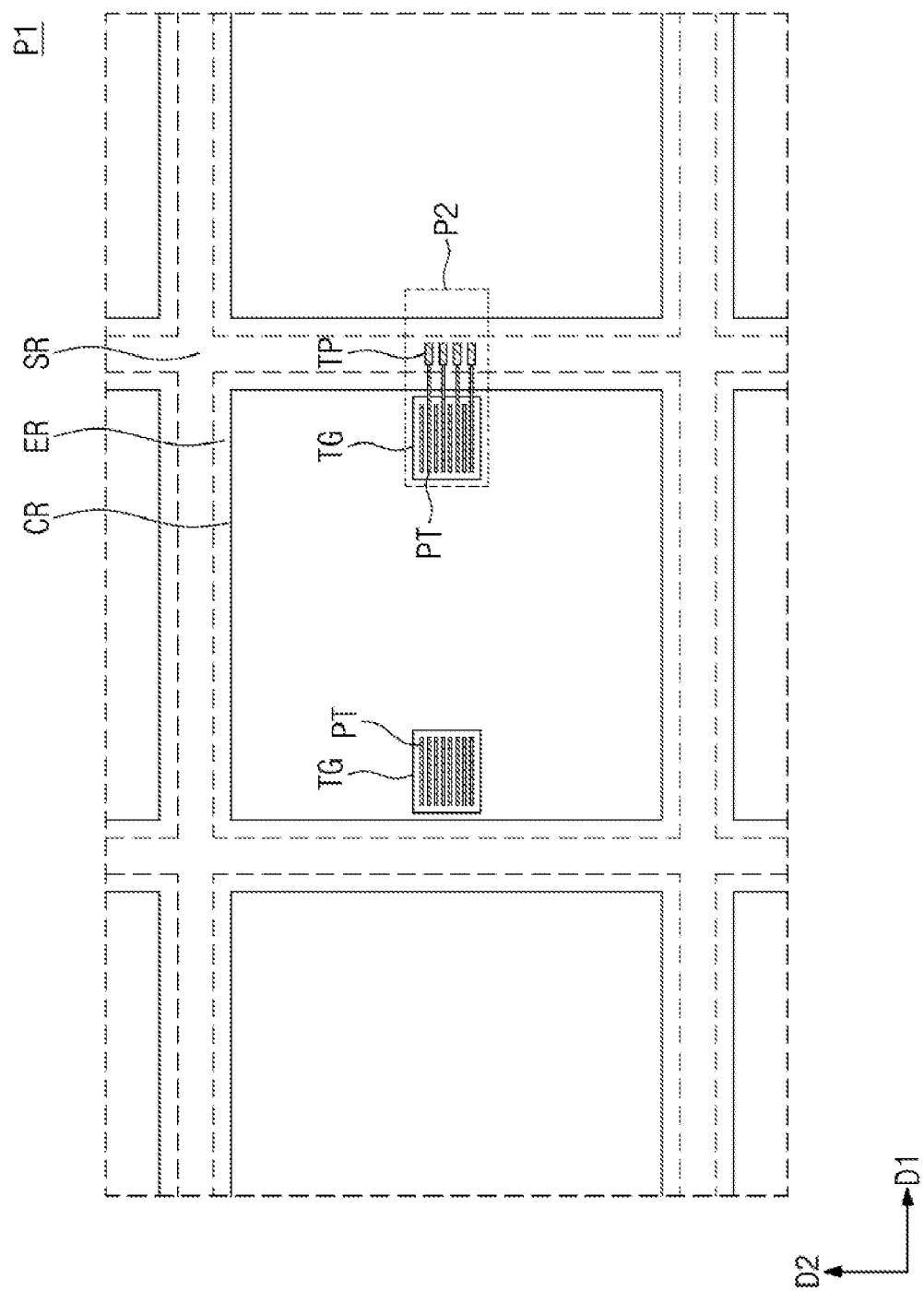
FIGS. 2A and 2B illustrate enlarged views showing section P1 of FIG. 1.
Figure 2B:
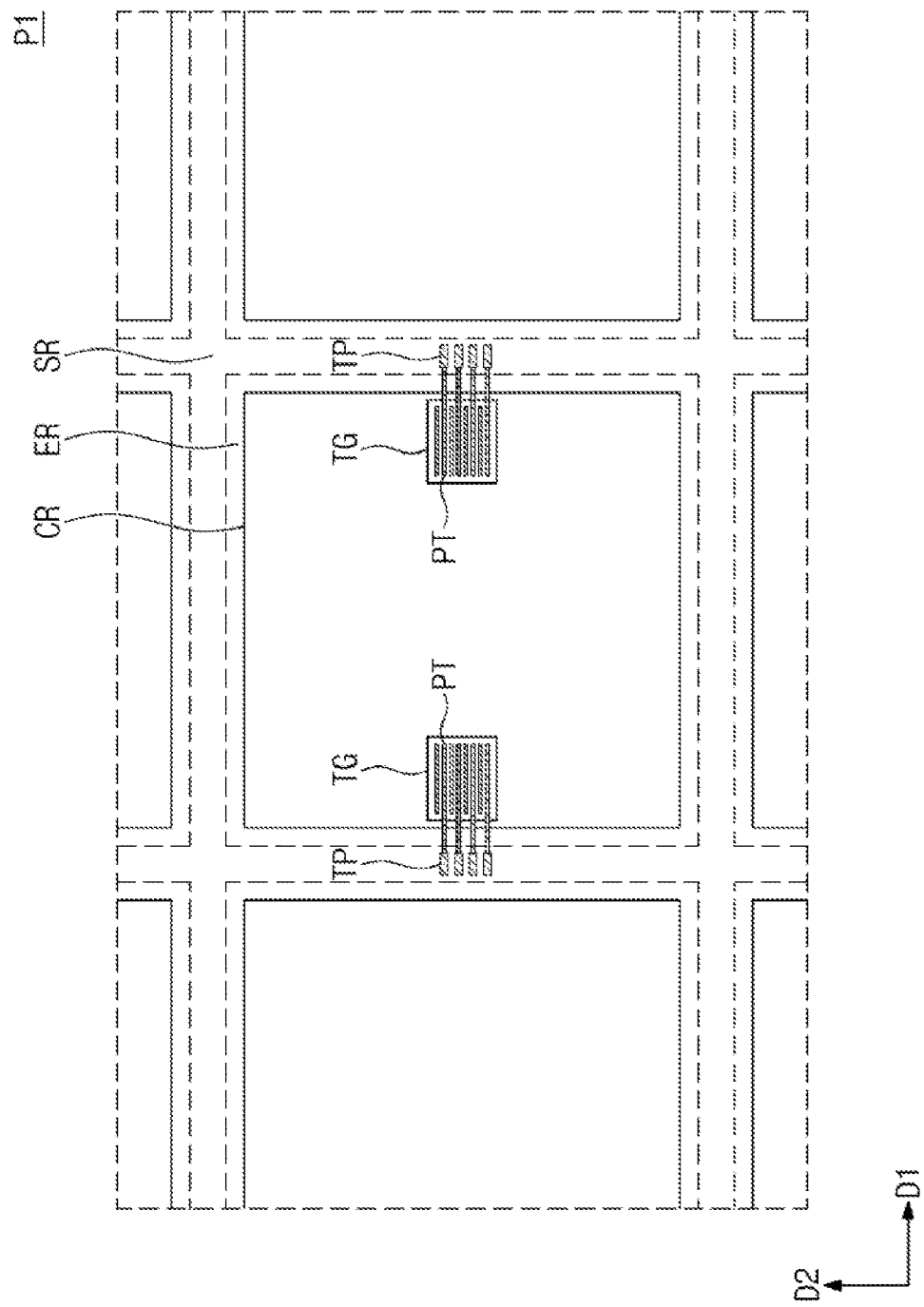
Figure 3:
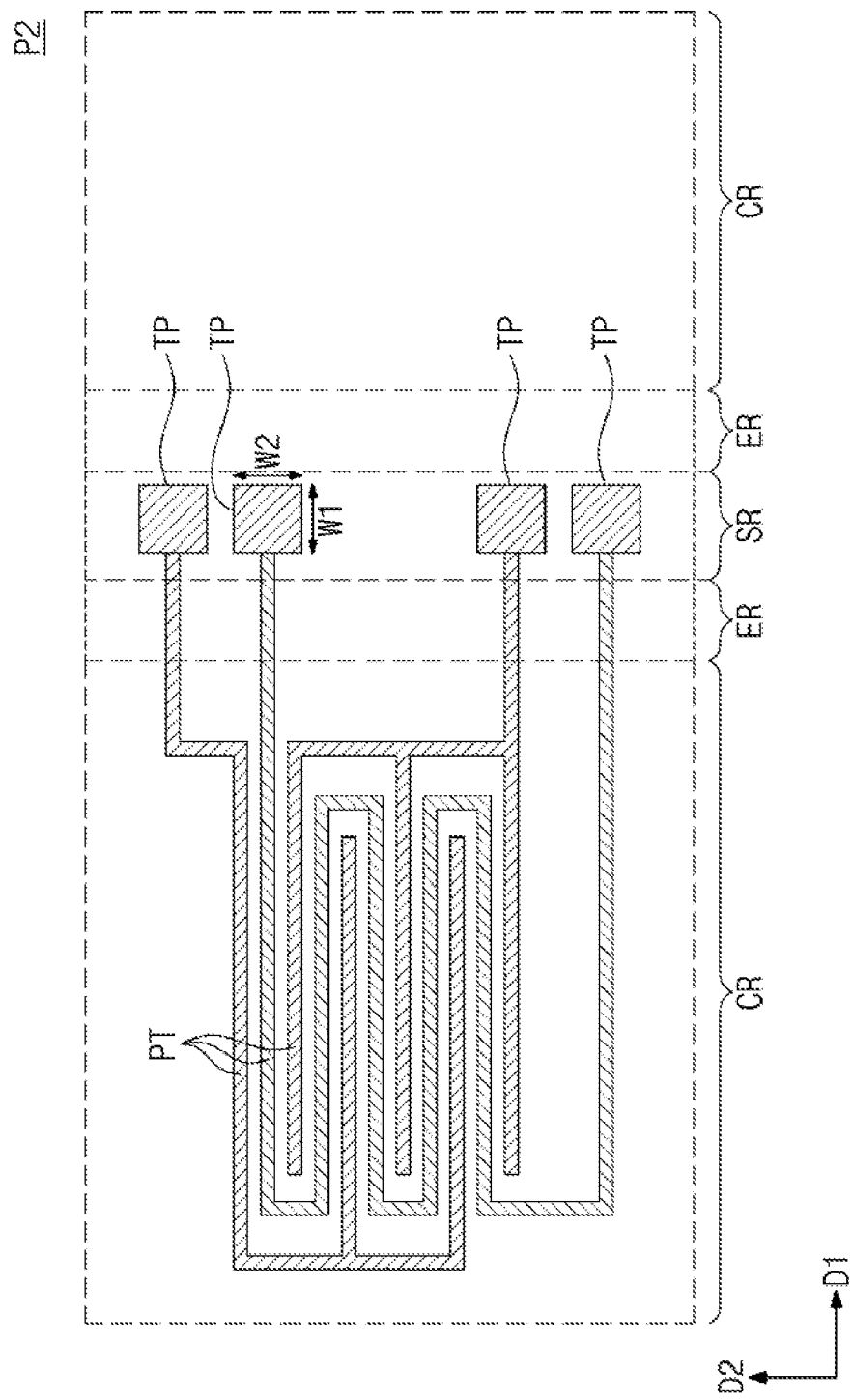
FIG. 3 illustrates an enlarged view showing section P2 of FIG. 2A.

FIG. 1 illustrates a plan view showing a substrate that includes a redistribution layer used for fabricating a semiconductor package, according to some example embodiments of the present inventive concepts. FIGS. 2A and 2B illustrate enlarged views showing section P1 of FIG. 1. FIG. 3 illustrates an enlarged view showing section P2 of FIG. 2A.

Referring to FIGS. 1 and 2A, a substrate W may include chip regions CR on which semiconductor chips are mounted and a scribe line region SR between the chip regions CR. The chip regions CR may be two-dimensionally arranged along a first direction D1 and a second direction D2 perpendicular to the first direction D1. The scribe line region SR may extend in the first and second directions D1 and D2 and may surround each of the chip regions CR. The substrate W may further include edge regions ER between the scribe line region SR and the chip regions CR. The edge regions ER may correspondingly surround the chip regions CR. For example, each edge region ER may surround a corresponding chip region CR.

The substrate W may be one of a semiconductor material (e.g., silicon wafer), a dielectric material (e.g., glass), and a semiconductor or conductor covered with a dielectric material.

A plurality of redistribution layers may be vertically stacked on the chip regions CR of the substrate W. Each of the redistribution layers may include a dielectric layer and redistribution patterns. The redistribution layer may have various functions based on a design of a related layer. The redistribution layer may include power and ground patterns, input/output signal patterns, and so forth. In this description, the power and ground patterns may be redistribution patterns to which power voltages and/or ground voltages are provided. The input/output signal patterns may be redistribution patterns to which data and control signals are provided.

Referring to FIGS. 2A and 2B, at least one of the chip regions CR may include test pattern groups TG. The test pattern groups TG may be provided to each of the chip regions CR.

Each of the test pattern groups TG may include redistribution test patterns PT used for testing electrical characteristics of the redistribution layers. For example, the redistribution test patterns PT may be used for testing open states, short states, resistance, or capacitance of the redistribution layers.

One or more redistribution test patterns PT of the test pattern groups TG may be connected to test pads TP positioned on the scribe line region SR. For example, referring to FIG. 2A, the test pattern groups TG may be correspondingly provided on opposite sides of the chip region CR, and the test pads TP on the scribe line region SR may be connected to one of the test pattern groups TG. For another example, referring to FIG. 2B, the test pads TP may be correspondingly connected to two of the test pattern groups TG.

In some example embodiments, referring to FIG. 3, the redistribution test patterns PT may have their line-widths, interval, and thicknesses substantially the same as those of the redistribution patterns in the redistribution layer. The redistribution test patterns PT may be disposed on the edge region ER and the chip region CR adjacent to the edge region ER, and the test pads TP may be disposed on the scribe line region SR. Alternatively, the test pads TP may be disposed on the edge region ER. The redistribution test patterns PT may extend from the chip region CR toward the edge region ER, and the test pads TP may be connected to distal ends of the redistribution test patterns PT.

Each of the test pads TP may have a horizontal width W1 of about 40 μm to about 60 μm in the first direction D1 and a vertical width W2 of about 40 μm to about 60 μm in the second direction D2.

Figure 4:
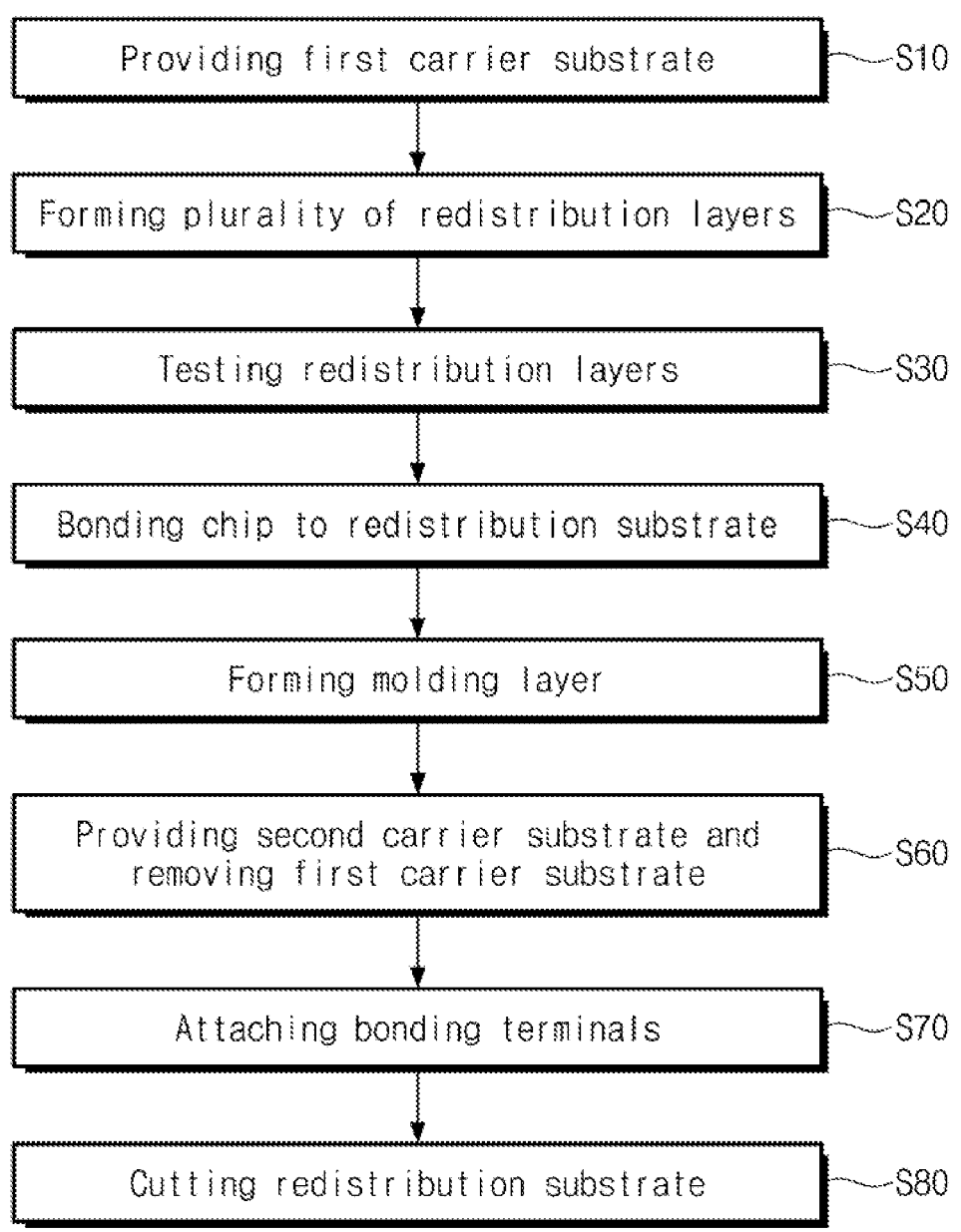
FIG. 4 illustrates a flow chart showing a method of fabricating a semiconductor package, according to some example embodiments of the present inventive concepts.

FIG. 4 illustrates a flow chart showing a method of fabricating a semiconductor package according to some example embodiments of the present inventive concepts. FIGS. 5 to 8 illustrate cross-sectional views showing a method of fabricating a semiconductor package according to some example embodiments of the present inventive concepts. FIGS. 9A and 9B illustrate cross-sectional views showing a semiconductor package achieved by a method of fabricating a semiconductor package according to some example embodiments of the present inventive concepts.

Figure 5:
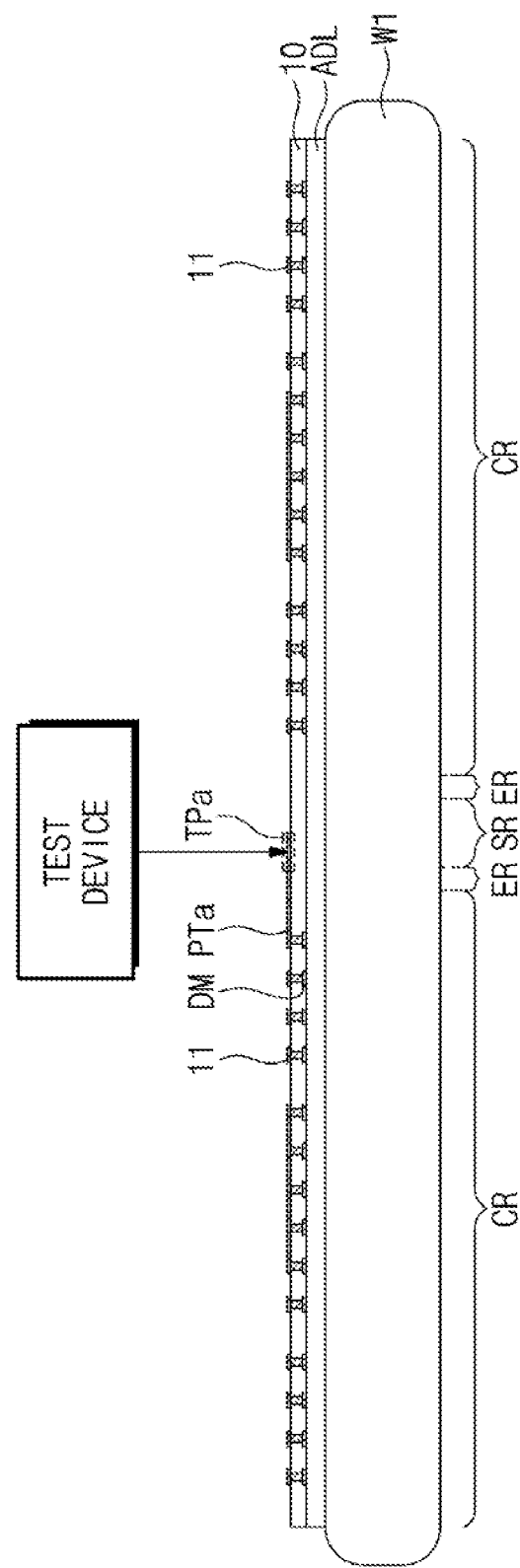
FIGS. 5 to 8 illustrate cross-sectional views showing a method of fabricating a semiconductor package, according to some example embodiments of the present inventive concepts.

Referring to FIGS. 4 and 5, a first carrier substrate W1 may be provided (S10). The first carrier substrate W1 may be a glass substrate.

The first carrier substrate W1 may include, as discussed with reference to FIG. 1, chip regions CR and a scribe line region SR between the chip regions CR. In addition, the first carrier substrate W1 may further include edge regions ER between the chip regions CR and the scribe line region SR.

A plurality of redistribution layers may be formed on the first carrier substrate W1 (S20). For example, first to fourth redistribution layers may be sequentially formed on the first carrier substrate W1. An adhesive layer ADL may be interposed between the first redistribution layer and the first carrier substrate W1.

For example, the first redistribution layer may be formed on the first carrier substrate W1. The formation of the first redistribution layer may include forming a first dielectric layer 10 on the adhesive layer ADL, and forming first redistribution patterns 11, first redistribution test patterns PTa, and first test pads TPa on the first dielectric layer 10. The first dielectric layer 10 may be formed by a coating process, such as spin coating or slit coating. The first dielectric layer 10 may include, for example, a photosensitive polymer. The photosensitive polymer may include, for example, one or more of photosensitive polyimide, polybenzoxazole, phenolic polymers, and benzocyclobutene polymers. Alternatively, the first dielectric layer 10 may be formed of, for example, a silicon oxide layer, a silicon nitride layer, or a silicon oxynitride layer.

The first redistribution patterns 11 may be formed on each of the chip regions CR. Each of the first redistribution patterns 11 may include a via part that penetrates the first dielectric layer 10 and a line part that is connected to the via part and is disposed on the first dielectric layer 10.

The formation of the first redistribution patterns 11 may include forming via holes that penetrate the first dielectric layer 10 and expose metal pads, forming a metal seed layer on a surface of the first dielectric layer 10 having the via holes, forming a photoresist pattern on the metal seed layer, using a plating process to form a metal pattern on the metal seed layer exposed by the photoresist pattern, and using the metal pattern as an etching mask to selectively etch the metal seed layer. The metal seed layer may be formed by a film deposition process, such as electroplating, electroless plating, or sputtering. The metal see layer may be formed of, for example, chromium (Cr), titanium (Ti), copper (Cu), nickel (Ni), tin (Sn), or any alloy thereof. The metal pattern may include a conductive material, such as copper (Cu), aluminum (Al), silver (Ag), tin (Sn), gold (Au), nickel (Ni), lead (Pb), titanium (Ti), or any alloy thereof.

In addition, when the first redistribution patterns 11 are formed, the chip region CR may be provided thereon with one or more dummy redistribution patterns DM that partially overlaps the first redistribution test patterns PTa. The first test pads TPa may be spaced apart at about 25 μm to about 40 μm from the dummy redistribution patterns DM. For example, the horizontal distance in one of the first or second directions D1 or D2 between the first test pads TPa and the dummy redistribution patterns DM may be in a range of about 25 μm to about 40 μm. The first redistribution patterns 11 may include under-bump metal (UBM) patterns.

The first redistribution patterns 11, the first redistribution test patterns PTa, and the first test pads TPa may be formed simultaneously with each other. To evaluate processes and characteristics of the first redistribution patterns 11, the first redistribution test patterns PTa may have their line-widths, interval, and thicknesses substantially the same as those of the first redistribution patterns 11.

The first redistribution test patterns PTa may be formed on the chip region CR while being spaced apart from the first redistribution patterns 11, and the first test pads TPa may be formed on the scribe line region SR while being connected with the first redistribution test patterns PTa. The first redistribution patterns 11, the first redistribution test patterns PTa, and the first test pads TPa may be formed as illustrated in FIG. 3.

After the formation of a first redistribution layer, a test device may be employed to perform a first redistribution test process in which the first test pads TPa of the first redistribution layer are used (S30). The first redistribution test process may be used to evaluate the first redistribution patterns 11. For example, the first test pads TPa may be in contact with probe pins of a probe card to evaluate whether the first redistribution test patterns PTa are in an open or short state.

Figure 6:
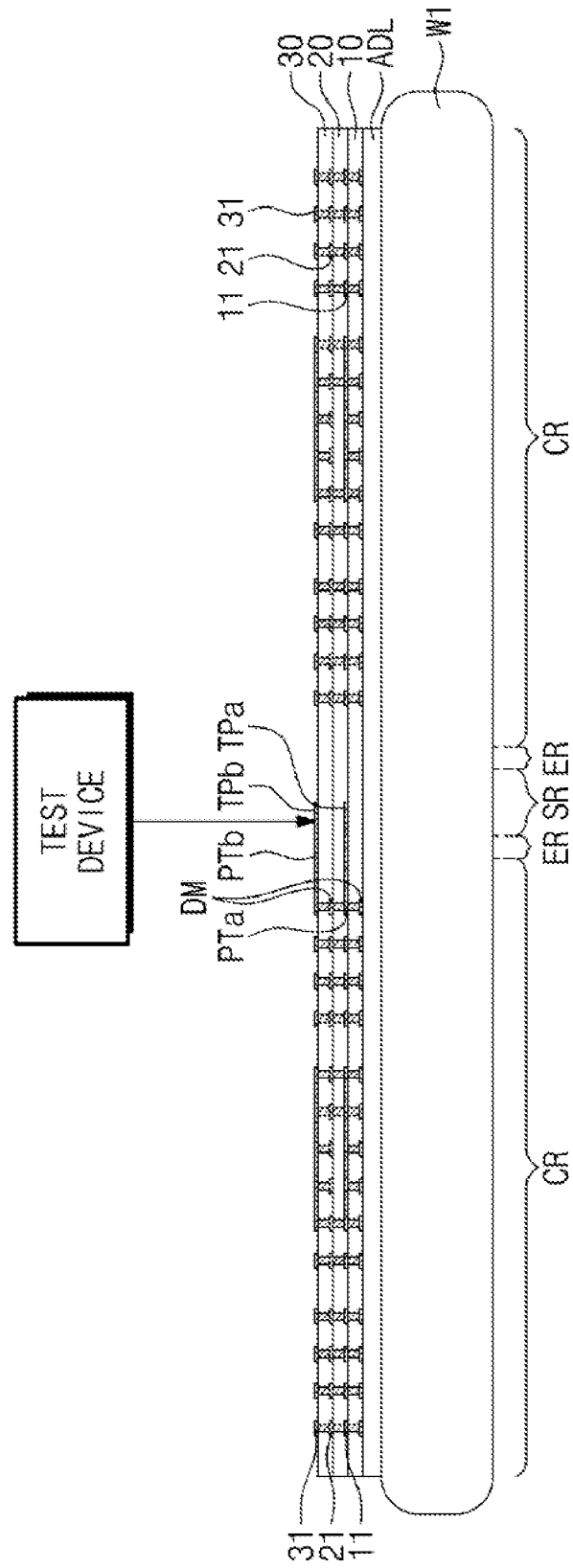

Referring to FIGS. 4 and 6, after the first redistribution test process, second and third redistribution layers may be sequentially formed on the first redistribution layer.

The formation of the second redistribution layer may include forming a second dielectric layer 20 on the first redistribution layer and forming second redistribution patterns 21 on the second dielectric layer 20.

The formation of the second redistribution patterns 21 may be substantially the same as the formation of the first redistribution patterns 11. When the second redistribution patterns 21 are formed, one or more dummy redistribution patterns DM may be formed on the first redistribution test patterns PTa.

The third redistribution layer may be formed on the second redistribution layer, and the formation of the third redistribution layer may include forming a third dielectric layer 30 on the second dielectric layer 20, and forming third redistribution patterns 31, second redistribution test patterns PTb, and second test pads TPb on the third dielectric layer 30.

The third redistribution patterns 31 and the second redistribution test patterns PTb may be formed on each of the chip regions CR, and the second test pads TPb connected to the second redistribution test patterns PTb may be formed on the scribe line region SR. To evaluate processes and characteristics of the third redistribution patterns 31, the second redistribution test patterns PTb may have their line-widths, interval, and thicknesses substantially the same as those of the third redistribution patterns 31.

After the formation of the third redistribution layer, a second redistribution test process may be performed in which the second test pads TPb of the third redistribution layer are used (S30). The second redistribution test process may be used to evaluate the third redistribution patterns 31.

Figure 7:
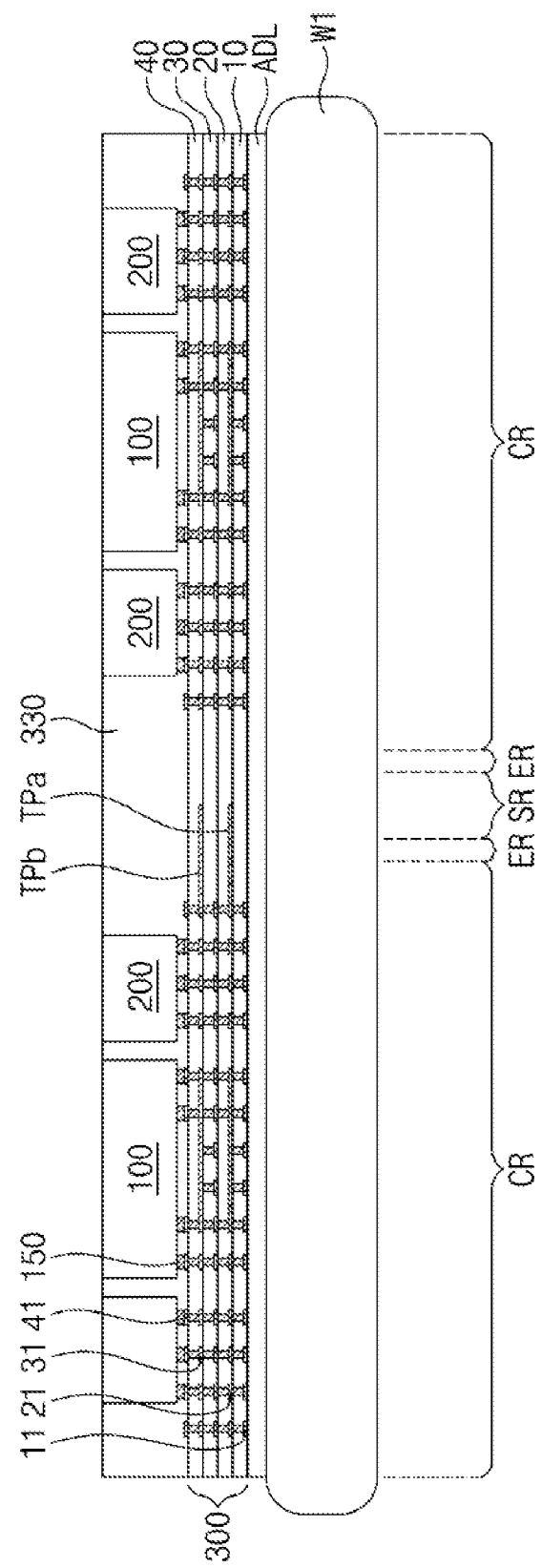

Referring to FIGS. 4 and 7, after the second redistribution test process, the third redistribution layer may be provided thereon with a fourth redistribution layer that includes a fourth dielectric layer 40 and fourth redistribution patterns 41. Therefore, a redistribution substrate 300 may be formed which includes the first to fourth redistribution layers. In some example embodiments, the redistribution substrate 300 is described to include the first to fourth redistribution layers, but the present inventive concepts are not limited thereto, and the number of the redistribution layers may be changed based on the kind of semiconductor package. The redistribution substrate 300 may have a plurality of upper bonding pads on a top surface thereof and a plurality of lower bonding pads on a bottom surface thereof.

For example, the first and third redistribution patterns 11 and 31 may be layers to which power voltages and/or ground voltages are applied, and the second and fourth redistribution patterns 21 and 41 may be layers to which data signals and/or control signals are applied.

In some example embodiments, it is explained that the first and second redistribution test patterns PTa and PTb are respectively formed on the first and third redistribution layers, but the present inventive concepts are not limited thereto, and redistribution patterns and test pads may be formed on each of the first to fourth redistribution layers.

Referring still to FIGS. 4 and 7, semiconductor chips 100 and 200 may be bonded to the redistribution substrate 300 (S40).

The semiconductor chips 100 and 200 may be attached through first connection terminals 150 to each of the chip regions CR of the redistribution substrate 300. The redistribution substrate 300 may be provided thereon with the semiconductor chips 100 and 200 that are two-dimensionally attached along a plurality of rows and columns. According to some example embodiments, the semiconductor chips 100 and 200 may not vertically overlap the first redistribution test patterns PTa, the second redistribution test patterns PTb, or the dummy redistribution patterns DM.

A molding layer 330 may be formed on the redistribution substrate 300, covering the semiconductor chips 100 and 200 (S50).

The molding layer 330 may be coated on the redistribution substrate 300 to cover top surface of the semiconductor chips 100 and 200, and then may undergo a thinning process to expose the top surface of the semiconductor chips 100 and 200. The molding layer 330 may fill spaces between the semiconductor chips 100 and 200. The molding layer 330 may include a dielectric polymer, such as an epoxy molding compound (EMC). The thinning process on the molding layer 330 may include a grinding process, a chemical mechanical polishing process, or an etching process.

Figure 8:
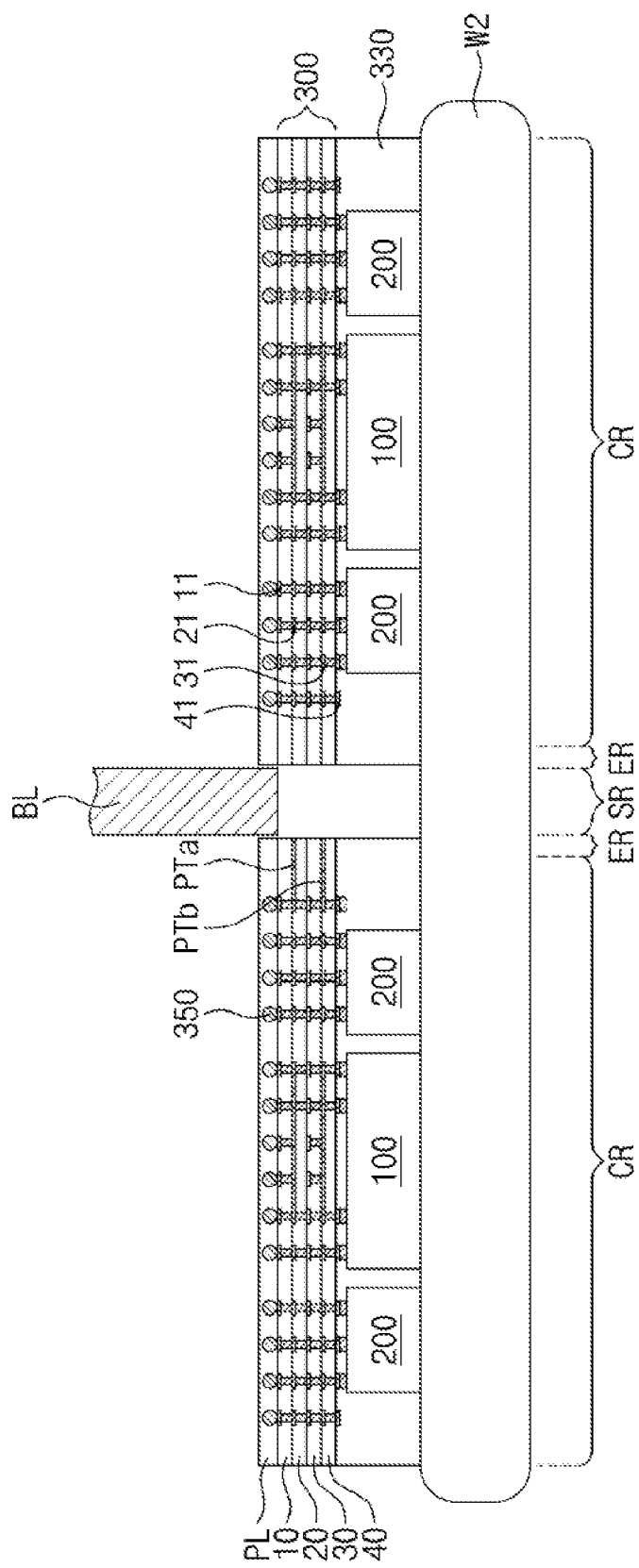
Figure 9A:
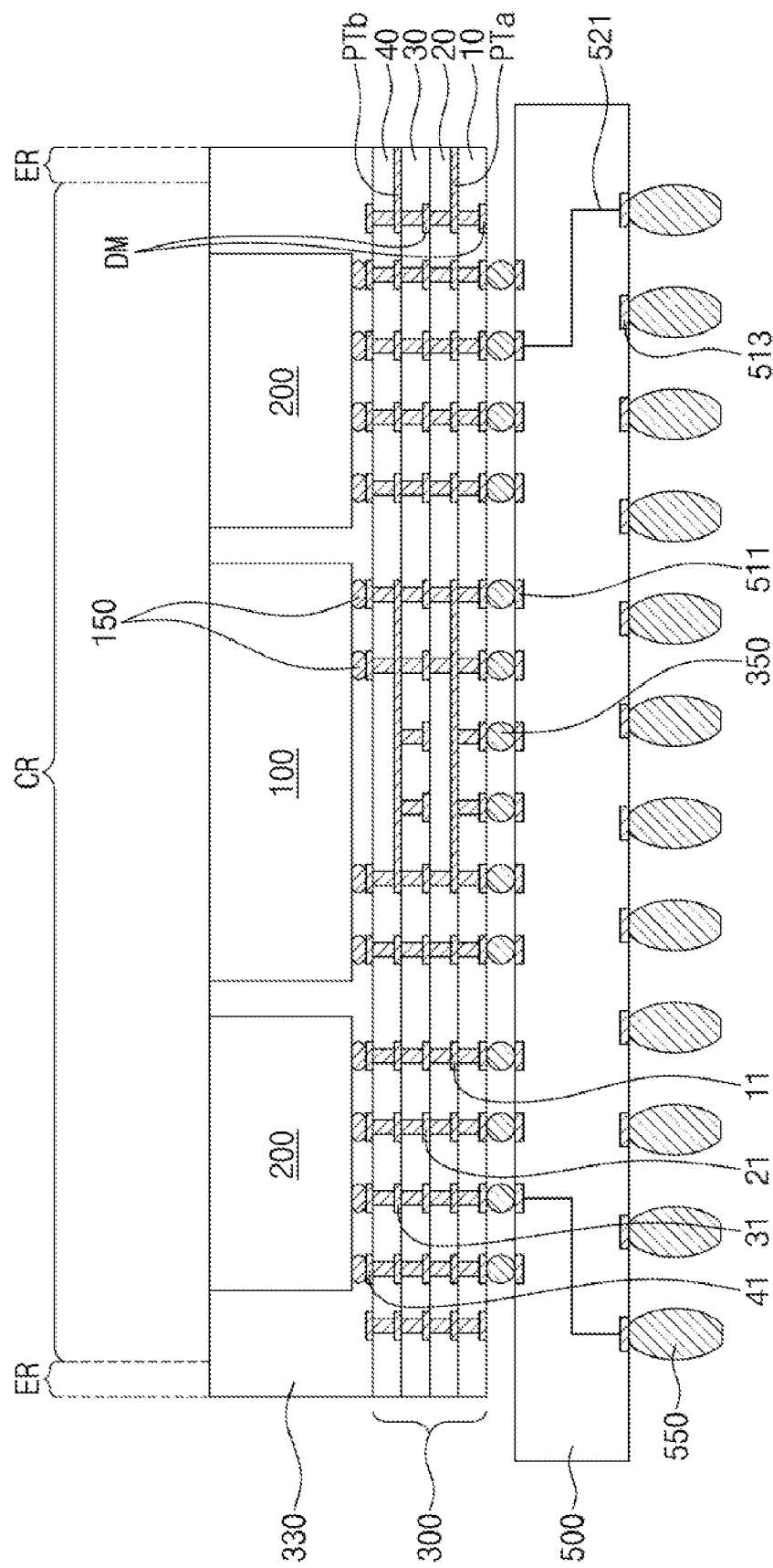
FIGS. 9A and 9B illustrate cross-sectional views showing a semiconductor package achieved by a method of fabricating a semiconductor package, according to some example embodiments of the present inventive concepts.
Figure 9B:
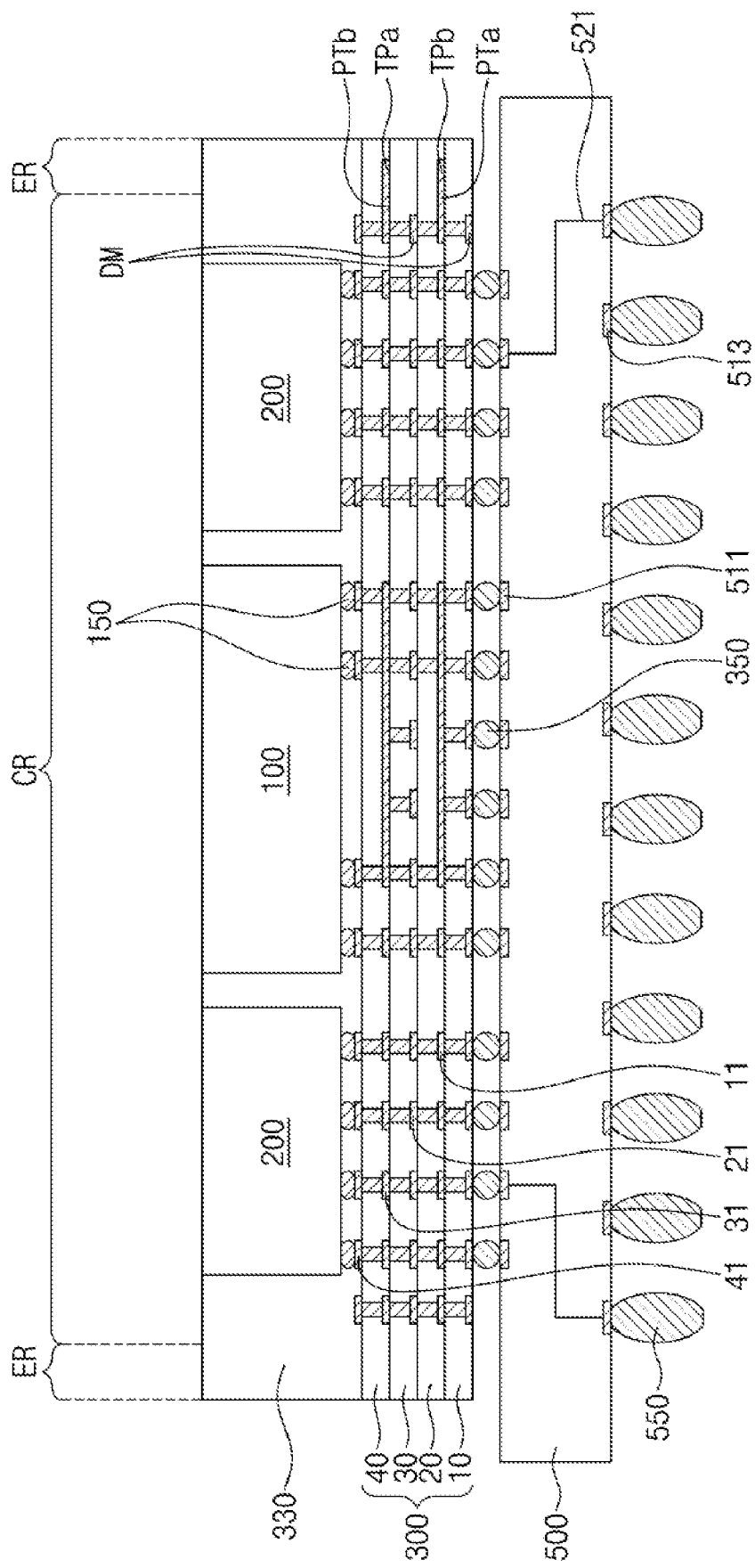

Referring to FIGS. 4 and 8, a second carrier substrate W2 may be provided on the top surfaces of the semiconductor chips 100 and 200 (S60). The second carrier substrate W2 may be attached through an adhesive layer (not shown) to the top surface of the semiconductor chips 100 and 200 and to a top surface of the molding layer 330.

After the attachment of the second carrier substrate W2, the adhesive layer ADL on the bottom surface of the redistribution substrate 300 may be removed to detach the first carrier substrate W1 (S60). The removal of the first carrier substrate W1 may expose the lower bonding pads of the redistribution substrate 300.

Second connection terminals 350 may be attached to the lower bonding pads of the redistribution substrate 300 (S70). The second connection terminals 350 may be electrically connected through the first, second, third, and fourth redistribution patterns 11, 21, 31, and 41 to the upper bonding pads of the redistribution substrate 300. The second connection terminals 350 may be solder balls formed of one or more of tin, lead, and copper.

After the formation of the second connection terminals 350, the redistribution substrate 300 may be provided on its bottom surface with a protection film PL attached to protect the second connection terminals 350.

A cutting device BL may be used to perform a cutting process in which the molding layer 330 and the redistribution substrate 300 are cut along the scribe line region SR of the redistribution substrate 300.

The cutting process may separate the chip regions CR of the redistribution substrate 300 into a plurality of individual semiconductor packages. The cutting process may use a sawing blade or a laser.

For example, when the first and second test pads TPa and TPb are positioned on the scribe line region SR, the cutting process may divide the first and second test pads TPa and TPb from the first and second redistribution test patterns PTa and PTb. Therefore, distal ends of the first and second redistribution test patterns PTa and PTb may remain on the edge regions ER. In this case, referring to FIG. 9A, because the first, second, third, and fourth dielectric layers 10, 20, 30, and 40 and the first and second redistribution test patterns PTa and PTb are cut on the scribe line region SR in the cutting process, sidewalls of the first and second redistribution test patterns PTa and PTb may be vertically aligned with sidewalls of the first, second, third, and fourth dielectric layers 10, 20, 30, and 40.

For another example, when the first and second test pads TPa and TPb are positioned on the edge region ER, as shown in FIG. 9B, the first and second test pads TPa and TPb may remain on the edge region ER after the cutting process.

Referring to FIGS. 9A and 9B, the separately divided semiconductor package may be mounted on a package substrate 500.

The package substrate 500 may include upper bonding pads 511, external bonding pads 513, and internal wiring lines 521. The second connection terminals 350 on the bottom surface of the redistribution substrate 300 may be attached to the upper bonding pads 511 of the package substrate 500.

After the semiconductor package is mounted on the package substrate 500, an under-fill layer (not shown) may fill a space between the redistribution substrate 300 and the package substrate 500. The under-fill layer may fill gaps between the second connection terminals 350. The under-fill layer may include, for example, a thermo-curable resin or a photo-curable resin.

External bonding terminals 550 may be attached to the external bonding pads 513 of the package substrate 500. A ball grid array (BGA) may be provided as the external bonding terminals 550.

Figure 10:
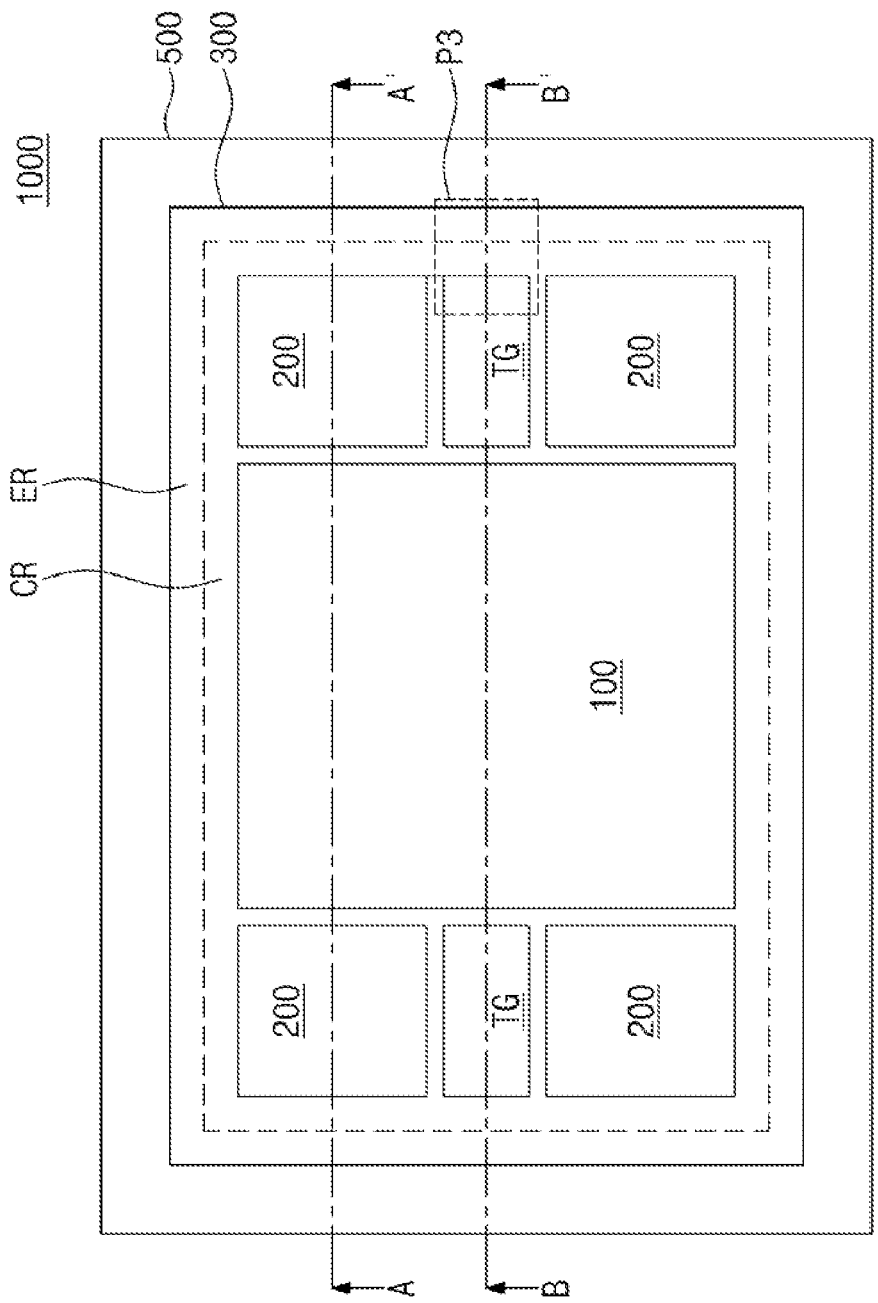
FIG. 10 illustrates a simplified plan view showing a semiconductor package module, according to some example embodiments of the present inventive concepts.
Figure 11A:
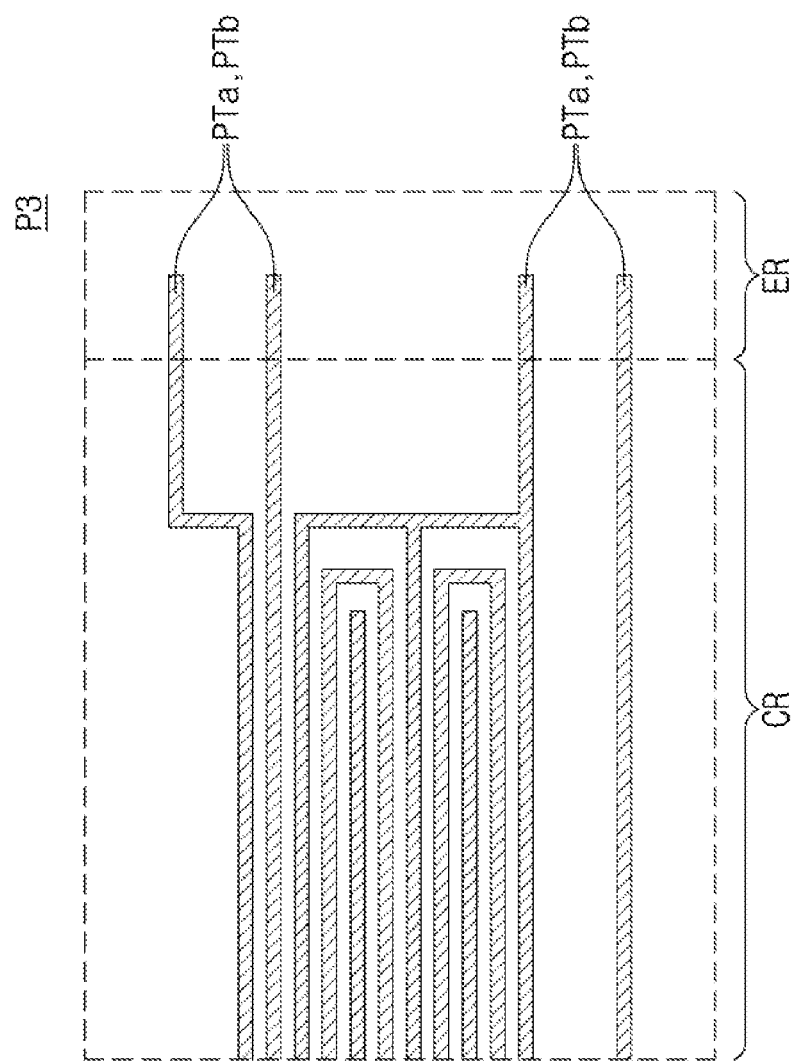
FIGS. 11A and 11B illustrate enlarged views showing section P3 of FIG. 10.
Figure 11B:
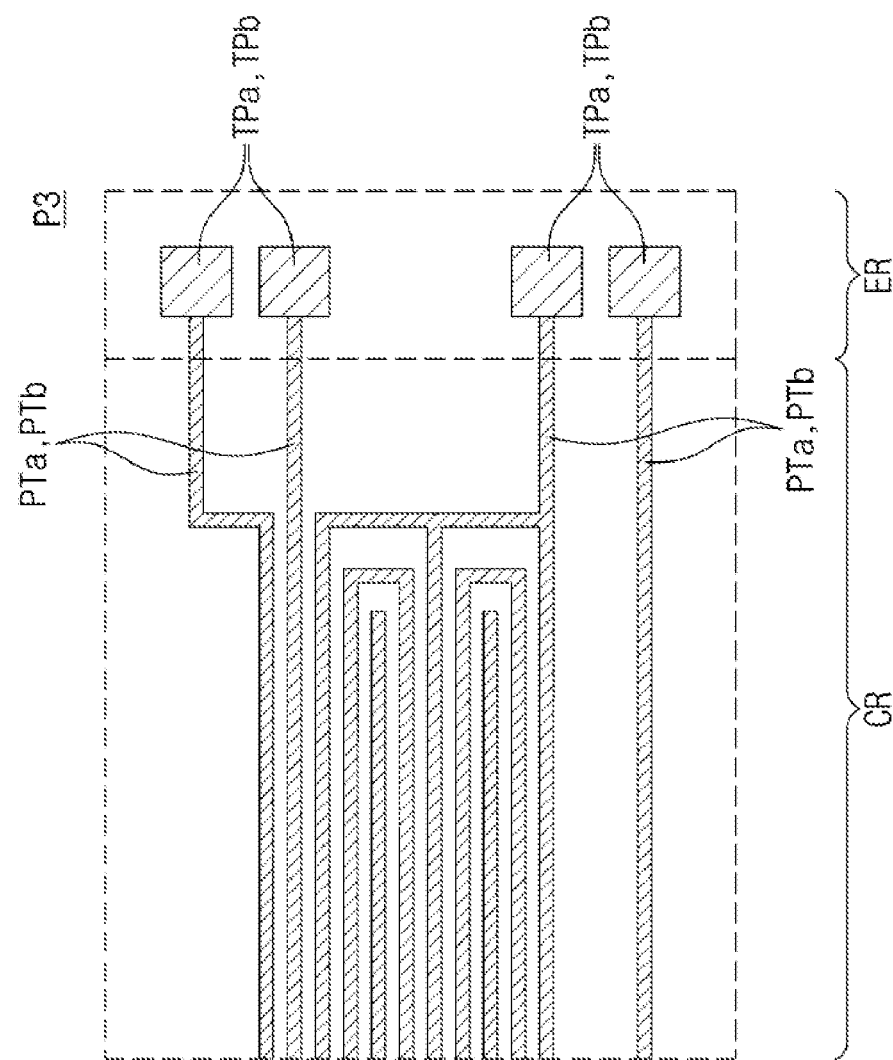
Figure 12A:
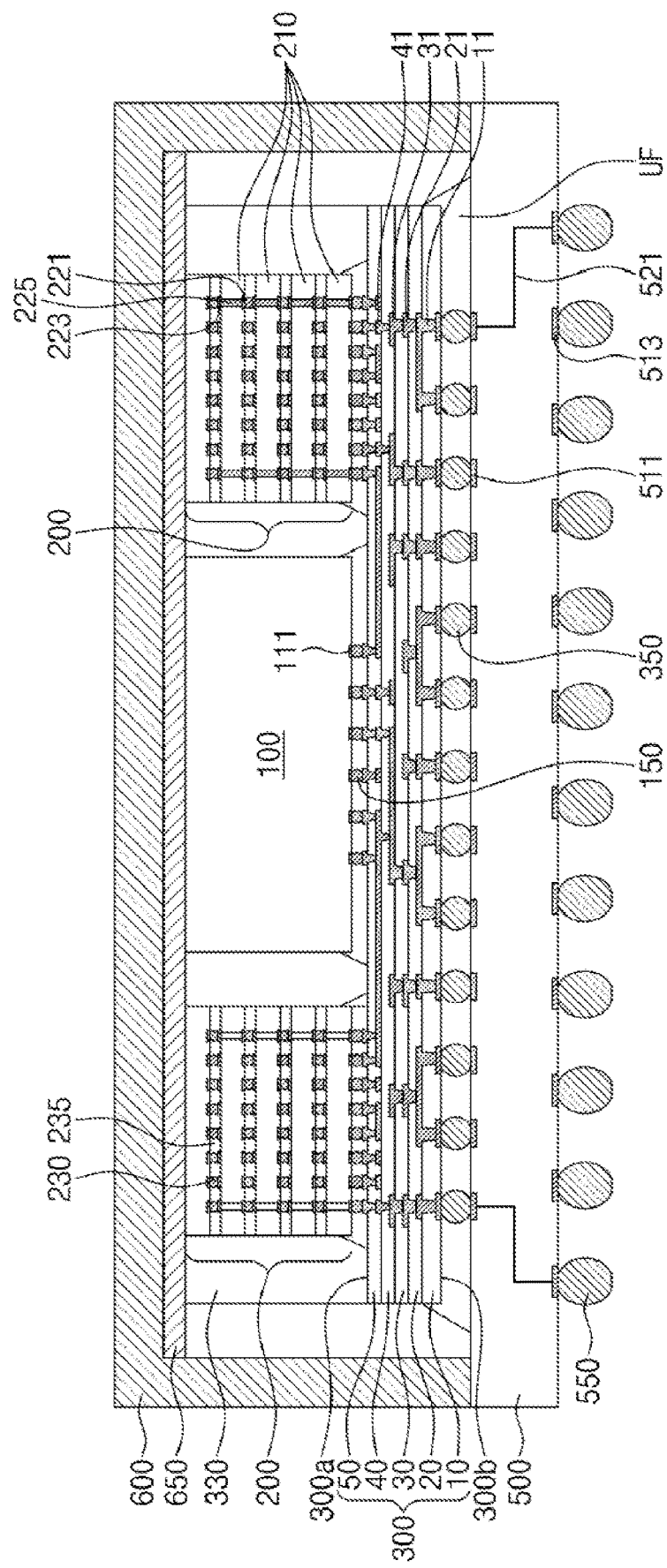
FIGS. 12A and 12B illustrate cross-sectional views taken along lines A-A' and B-B' of FIG. 10, showing a semiconductor package module, according to some example embodiments of the present inventive concepts.
Figure 12B:
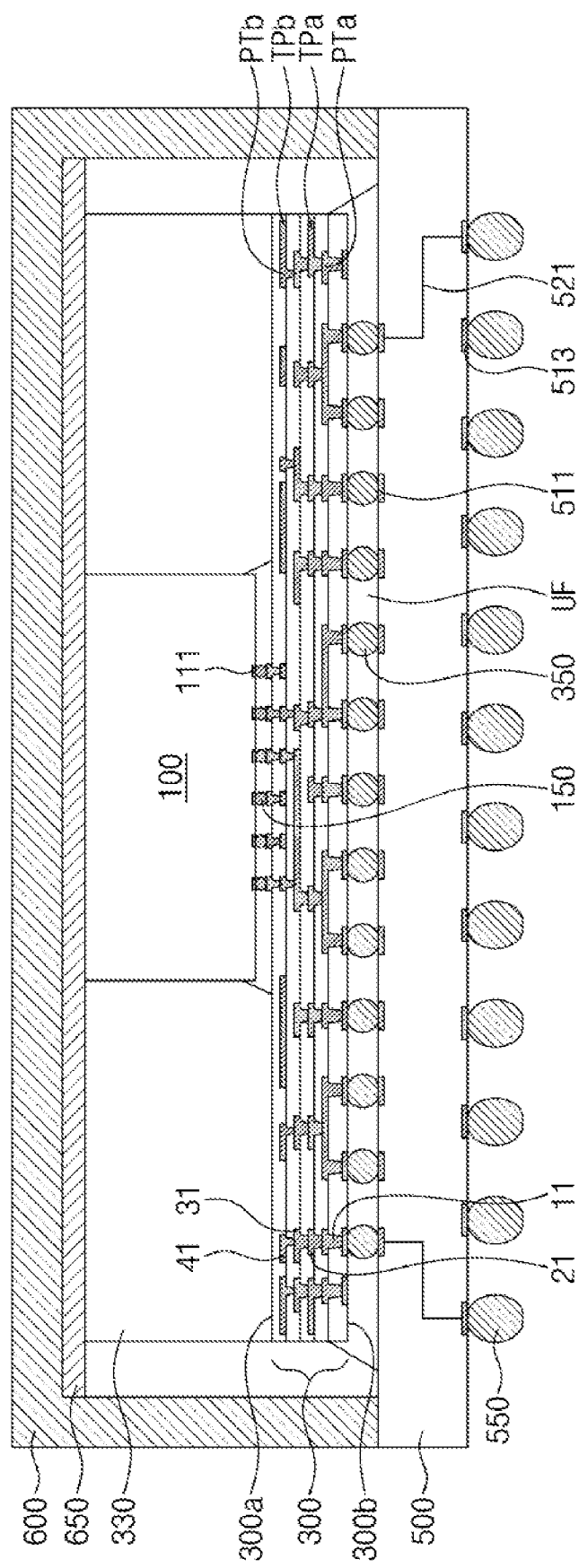
Figure 13:
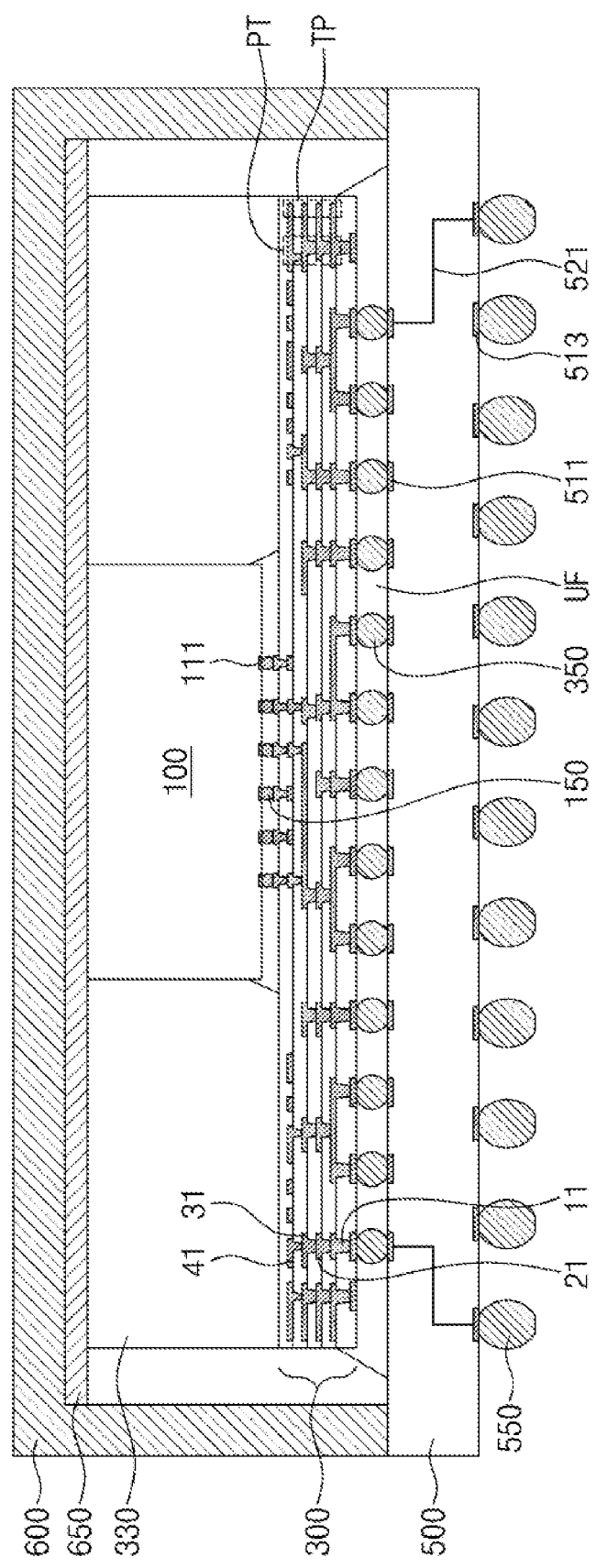
FIG. 13 illustrates a cross-sectional view taken along line B-B' of FIG. 10, showing a semiconductor package module, according to some example embodiments of the present inventive concepts.

FIG. 10 illustrates a simplified plan view showing a semiconductor package module according to some example embodiments of the present inventive concepts. FIGS. 11A and 11B illustrate enlarged views showing section P3 of FIG. 10. FIGS. 12A and 12B illustrate cross-sectional views taken along lines A-A' and B-B' of FIG. 10, showing a semiconductor package module according to some example embodiments of the present inventive concepts. FIG. 13 illustrates a cross-sectional view taken along line B-B' of FIG. 10, showing a semiconductor package module according to some example embodiments of the present inventive concepts.

Referring to FIGS. 10, 12A, and 12B, a semiconductor package module may include first and second semiconductor chips 100 and 200, a redistribution substrate 300, a package substrate 500, and a thermal radiation structure 600.

The redistribution substrate 300 may include, as discussed above, a chip region CR and an edge region ER around the chip region CR. The chip region CR may be provided with the first and second semiconductor chips 100 and 200 that are disposed on a top surface of the redistribution substrate 300. For example, the first and second semiconductor chips 100 and 200 may vertically overlap the chip region CR, but may not vertically overlap the edge region ER.

The first semiconductor chip 100 may have lower chip pads 111 on a bottom surface thereof. The first semiconductor chip 100 may be a logic chip including a processor, such as a microelectromechanical system (MEMS) device, an optoelectronic device, a central processing unit (CPU), a graphic processing unit (GPU), a mobile application, or a digital signal processor (DSP). The first semiconductor chip 100 may have a thickness of about 700 μm to about 775 μm. As used herein, thickness may refer to a thickness or height measured in a direction perpendicular to a top surface of the redistribution substrate (e.g., redistribution substrate 300).

The redistribution substrate 300 may be provided thereon with the second semiconductor chips 200 spaced apart from the first semiconductor chip 100. Each of the second semiconductor chips 200 may include a plurality of memory chips 210 that are vertically stacked. The plurality of memory chips 210 may be electrically connected to each other through lower and upper chip pads 221 and 223, chip through vias 225, and connection bumps 230. The memory chips 210 may be stacked on the redistribution substrate 300 to achieve alignment of their sidewalls. Adhesive layers 235 may be provided between the memory chips 210. The adhesive layer 235 may be, for example, a polymer tape including a dielectric material. The adhesive layer 235 may be interposed between the connection bumps 230, and thus an electrical short may be prevented between the connection bumps 230.

The first and second semiconductor chips 100 and 200 may be connected through first connection terminals 150 to the redistribution substrate 300. The first connection terminals 150 may be attached between upper bonding pads of the redistribution substrate 300 and the lower chip pads 111 and 221 of the first and second semiconductor chips 100 and 200. The first connection terminals 150 may be at least one selected from solder balls, conductive bumps, and conductive pillars. The first connection terminals 150 may include one or more of copper, tin, and lead. The first connection terminals 150 may each have a thickness of, for example, about 30 μm to about 70 μm.

The redistribution substrate 300 may be provided thereon with a molding layer 330 that covers the first and second semiconductor chips 100 and 200. The molding layer 330 may have a sidewall aligned with that of the redistribution substrate 300. The molding layer 330 may have a top surface substantially coplanar with those of the first and second semiconductor chips 100 and 200. The molding layer 330 may include a dielectric polymer, such as an epoxy molding compound (EMC).

A first under-fill layer may be interposed between the first semiconductor chip 100 and the redistribution substrate 300 and between the second semiconductor chips 200 and the redistribution substrate 300. The first under-fill layer may fill gaps between the first connection terminals 150. The first under-fill layer may include, for example, a thermo-curable resin or a photo-curable resin. The first under-fill layer may further include inorganic fillers or organic fillers. In some example embodiments, the first under-fill layer may be omitted, and instead a molding layer 330 may fill gaps between the redistribution substrate 300 and bottom surfaces of the first and second semiconductor chips 100 and 200.

The redistribution substrate 300 may be disposed on the package substrate 500, and may be connected through second connection terminals 350 to the package substrate 500. The redistribution substrate 300 may include the chip region CR and the edge region ER around the chip region CR. The first and second semiconductor chips 100 and 200 may be disposed on the chip region CR of the redistribution substrate 300.

The redistribution substrate 300 may have a top surface 300a adjacent to the first and second semiconductor chips 100 and 200, and may also have a bottom surface 300b opposite to the top surface 300a. The bottom surface 300b may be adjacent to the package substrate 500. The redistribution substrate 300 may include, identically or similarly to that discussed above, first, second, third, and fourth dielectric layers 10, 20, 30, and 40 that are sequentially stacked, and may also include first, second, third, and fourth redistribution patterns 11, 21, 31, and 41 in the first, second, third, and fourth dielectric layers 10, 20, 30, and 40, respectively. The redistribution substrate 300 may further include a fifth dielectric layer 50 on the fourth dielectric layer 40.

In some example embodiments, the redistribution substrate 300 may include, as discussed above with reference to FIG. 2A or FIG. 2B, at least one test pattern group TG. The test pattern group TG may be spaced apart from the first and second semiconductor chips 100 and 200, and thus may vertically overlap neither the first semiconductor chip 100 nor the second semiconductor chips 200. For example, a plurality of test pattern groups TG may be provided on opposite sides of the first semiconductor chip 100 and between the second semiconductor chips 200.

The redistribution substrate 300 may include, as discussed above with reference to FIGS. 5 to 9A, first, second, third, and fourth redistribution layers, which may include the first, second, third, and fourth redistribution patterns 11, 21, 31, and 41, respectively. In addition, the first and third redistribution layers may include redistribution test patterns PTa and PTb, respectively. As discussed above with reference to FIGS. 4 to 9B, the redistribution test patterns PTa and PTb may be formed simultaneously with the redistribution patterns 11, 21, 31, and 41 of the chip region CR. Therefore, the redistribution test patterns PTa and PTb may have their line-widths, intervals, and thicknesses substantially the same as those of the redistribution patterns 11, 21, 31, and 41.

According to an example embodiment shown in FIG. 13, the redistribution substrate 300 may include first, second, third, and fourth redistribution patterns 11, 21, 31, and 41 and first, second, third, and fourth redistribution test patterns PT in first, second, third, and fourth redistribution layers. Therefore, when the redistribution substrate 300 is formed, a test process may be performed on the redistribution test patterns PT whenever each of the first to fourth redistribution layers is formed.

Referring to FIG. 11A, the redistribution test patterns PTa and PTb may be placed on the chip region CR, and may have their distal ends positioned on the edge region ER. In this case, the redistribution test patterns PTa and PTb may have their sidewalls that are vertically aligned with those of the first to fourth dielectric layers 10, 20, 30, and 40.

For another example, referring to FIG. 11B, the redistribution test patterns PTa and PTb may have their distal ends positioned on the edge region ER, and the test pads TPa and TPb may also be positioned on the edge region ER.

Second connection terminals 350 may be attached to lower bonding pads of the redistribution substrate 300. The second connection terminals 350 may be solder balls formed of one or more of tin, lead, and copper. The second connection terminals 350 may each have a thickness of about 40 μm to about 80 μm.

An under-fill layer UF may be interposed between the redistribution substrate 300 and the package substrate 500, and the under-fill layer UF may fill gaps between the second connection terminals 350.

The package substrate 500 may be, for example, a printed circuit board, a flexible substrate, or a tape substrate. For example, the package substrate 500 may be one of a flexible printed circuit board, a rigid printed circuit board, and any combination thereof, each of which boards includes internal wiring lines 521 formed therein.

The package substrate 500 may have a top surface and a bottom surface that are opposite to each other, and may include upper bonding pads 511, external bonding pads 513, and internal wiring lines 521. The upper bonding pads 511 may be arranged on the top surface of the package substrate 500, and the external bonding pads 513 may be arranged on the bottom surface of the package substrate 500. The upper bonding pads 511 may be electrically connected through the internal wiring lines 521 to the external bonding pads 513. External bonding terminals 550 may be attached to the external bonding pads 513. A ball grid array (BGA) may be provided as the external bonding terminals 550.

The thermal radiation structure 600 may include a thermal conductive material. The thermal conductive material may include a metallic material (e.g., copper and/or aluminum) or a carbon-containing material (e.g., graphene, graphite, and/or carbon nano-tube). The thermal radiation structure 600 may have a relatively high thermal conductivity. For example, a single metal layer or a plurality of stacked metal layers may be used as the thermal radiation structure 600. For another example, the thermal radiation structure 600 may include a heat sink or a heat pipe. For another example, the thermal radiation structure 600 may be configured to use water cooling.

A thermal conductive layer 650 may be interposed between the thermal radiation structure 600 and the first and second semiconductor chips 100 and 200. The thermal conductive layer 650 may be in contact with top surfaces of the first and second semiconductor chips 100 and 200, a top surface of the molding layer 330, and a bottom surface of the thermal radiation structure 600. The thermal conductive layer 650 may include a thermal interface material (TIM). The thermal interface material may include, for example, a polymer and thermal conductive particles. The thermal conductive particles may be dispersed in the polymer. When the semiconductor package operates, heat produced from the semiconductor package may be transferred through the thermal conductive layer 650 to the thermal radiation structure 600.

Figure 14A:
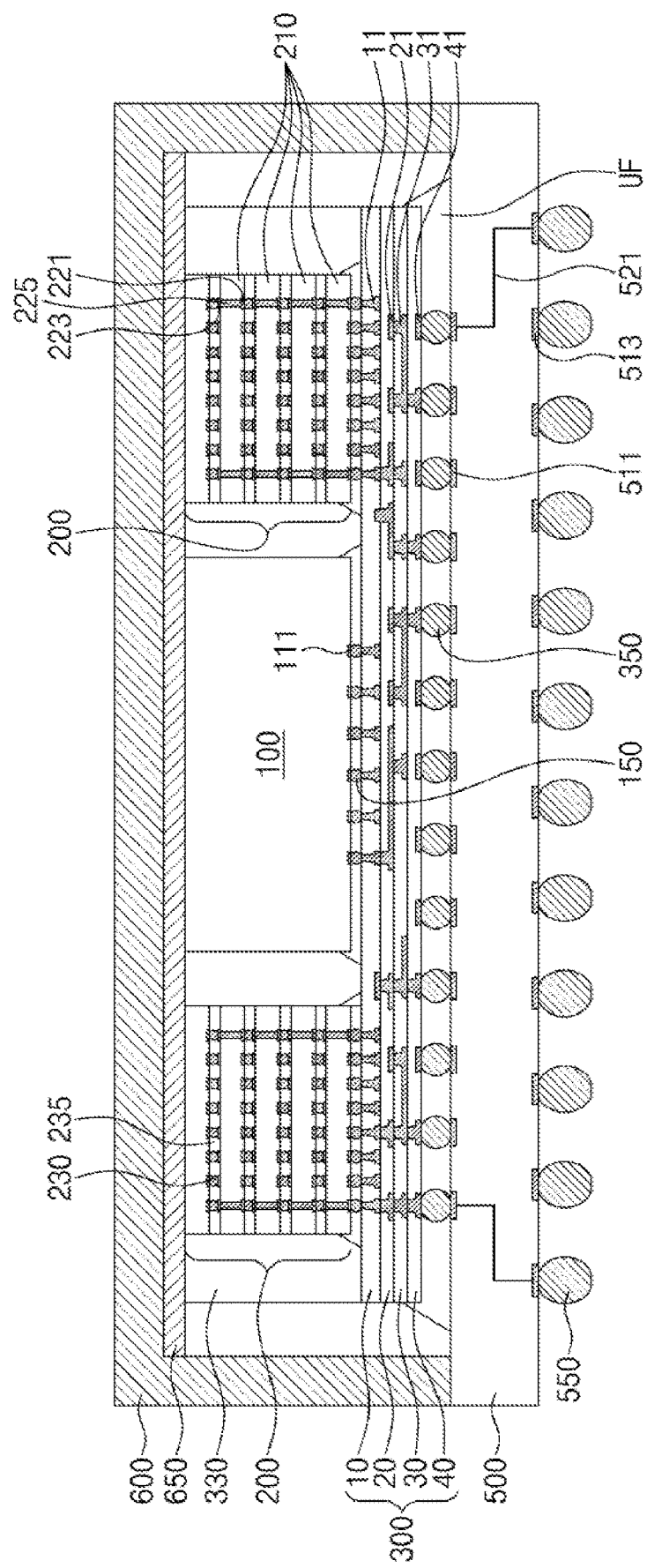
FIGS. 14A and 14B illustrate cross-sectional views taken along lines A-A' and B-B' of FIG. 10, showing a semiconductor package module, according to some example embodiments of the present inventive concepts.
Figure 14B:
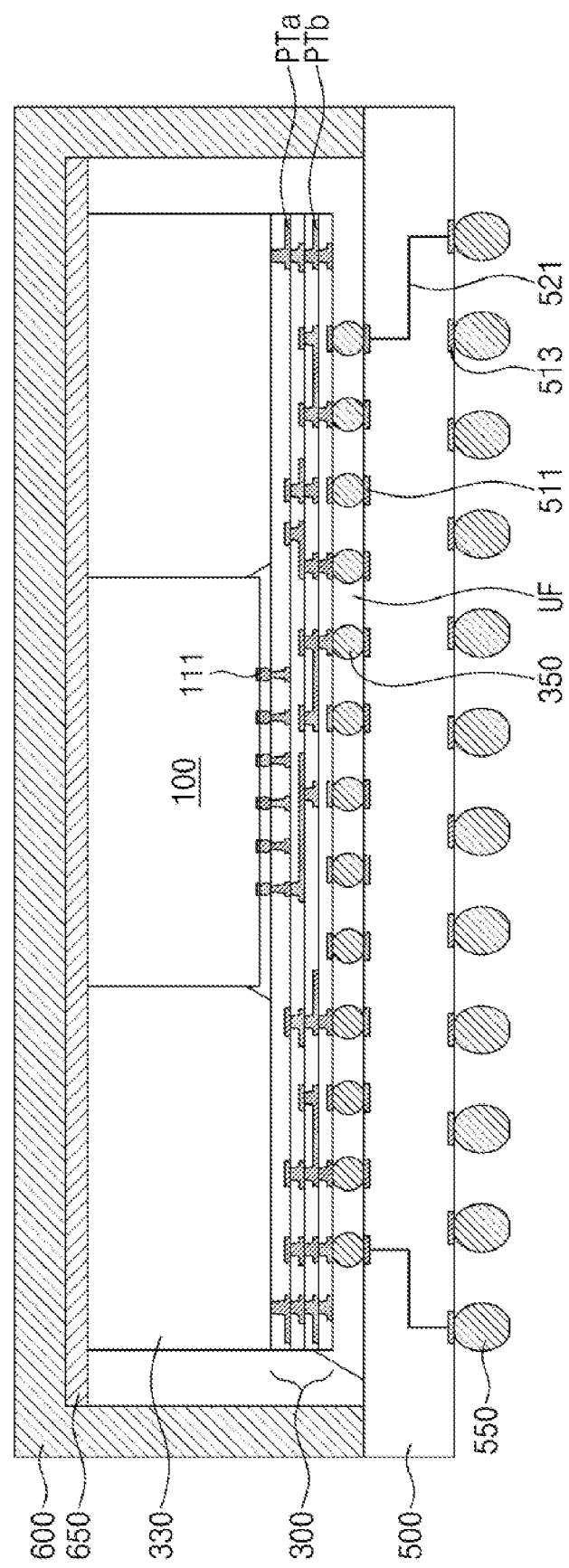

FIGS. 14A and 14B illustrate cross-sectional views taken along lines A-A' and B-B' of FIG. 10, showing a semiconductor package module according to example embodiments of the present inventive concepts.

Referring to FIGS. 14A and 14B, differently from the embodiment of FIG. 12A or 12B, a semiconductor package may include a redistribution substrate 300 formed on active surfaces of the first and second semiconductor chips 100 and 200.

For example, as discussed above with reference to FIGS. 5 to 9A, the redistribution substrate 300 may include first, second, third, and fourth redistribution layers, which may include first, second, third, and fourth redistribution patterns 11, 21, 31, and 41, respectively, and the first and third redistribution layers may include redistribution test patterns PTa and PTb, respectively. The first redistribution layer may be adjacent to chip pads 111 and 221 of first and second semiconductor chip 100 and 200, and the first redistribution patterns 11 may be connected to the chip pads 111 and 221 of the first and second semiconductor chips 100 and 200. In addition, the first to fourth redistribution layers may be configured such that a via part of each of the first, second, third, and fourth redistribution patterns 11, 21, 31, and 41 may be adjacent to the first and second semiconductor chips 100 and 200.

Figure 15:
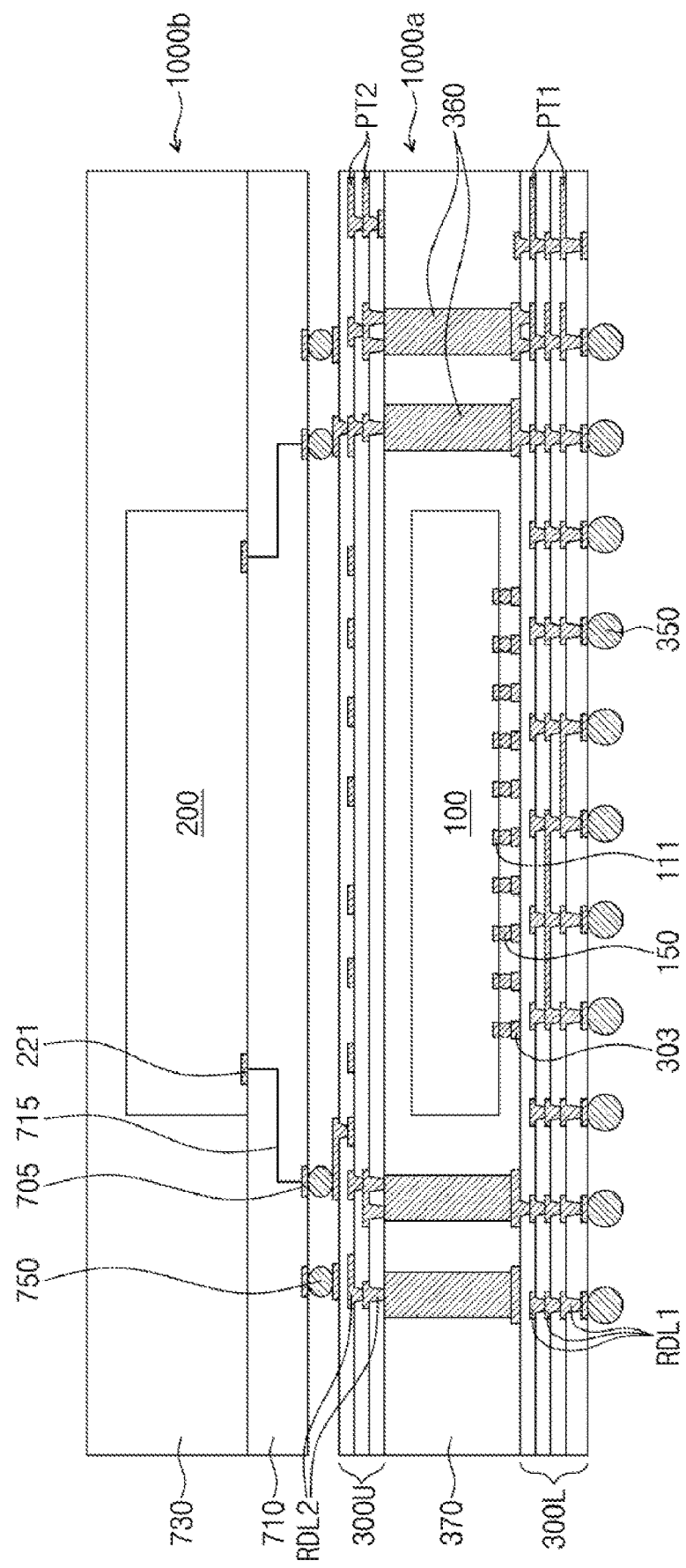
FIGS. 15 to 17 illustrate cross-sectional views showing a semiconductor package, according to some example embodiments of the present inventive concepts.
Figure 16:
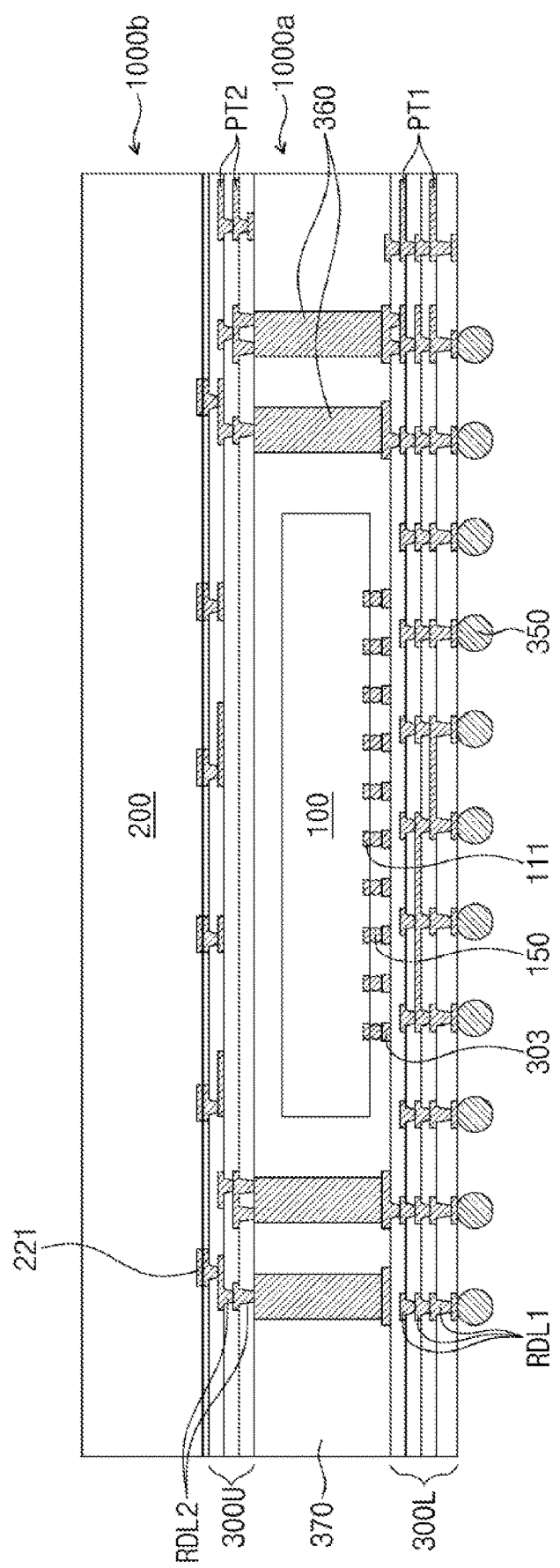
Figure 17:
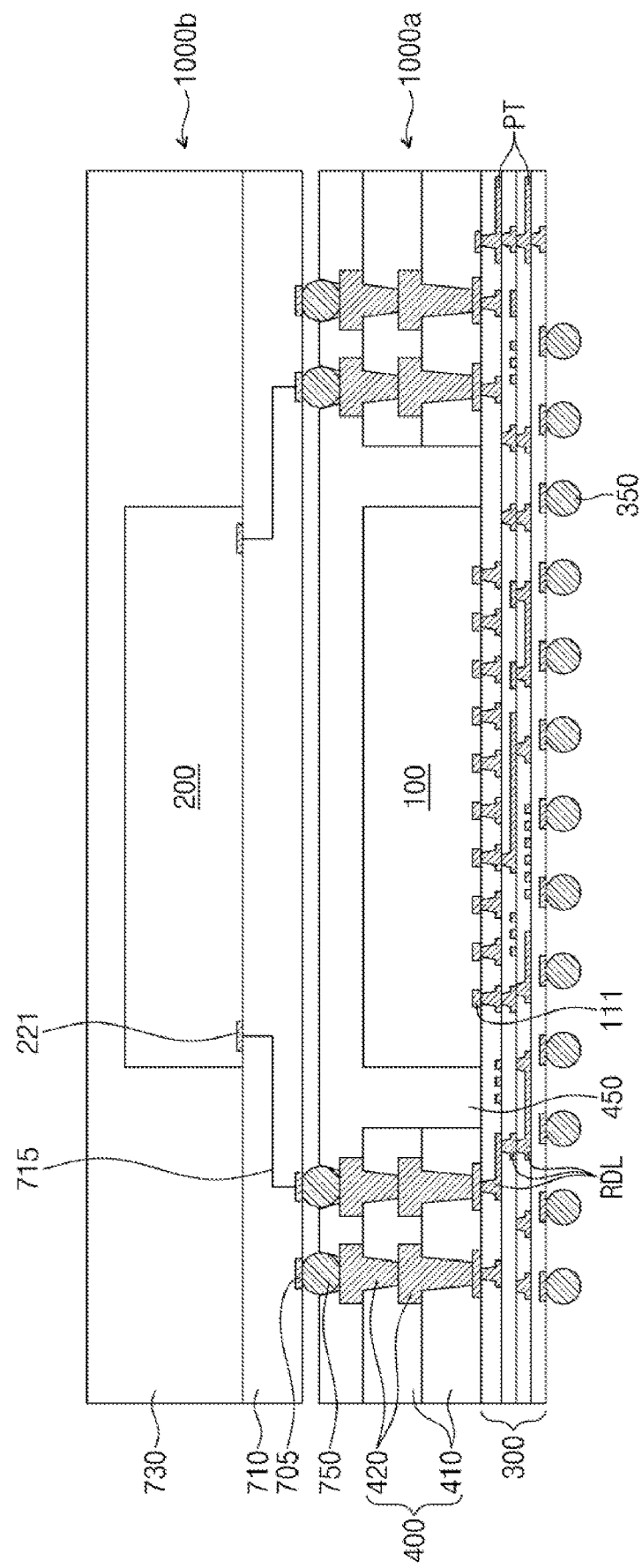

FIGS. 15 to 17 illustrate cross-sectional views showing a semiconductor package according to some example embodiments of the present inventive concepts.

Referring to FIG. 15, a semiconductor package according to the present embodiment may include a first semiconductor package 1000a and a second semiconductor package 1000b disposed on the first semiconductor package 1000a.

The first semiconductor package 1000a may include a lower redistribution substrate 300L, an upper redistribution substrate 300U, a first semiconductor chip 100, metal pillars 360, and a molding layer 370.

The lower redistribution substrate 300L may include a plurality of lower dielectric layers and a plurality of lower redistribution patterns RDL1 provided in the lower dielectric layers. The upper redistribution substrate 300U may include a plurality of upper dielectric layers and a plurality of upper redistribution patterns RDL2 provided in the upper dielectric layers.

According to some example embodiments, lower test patterns PT1 may be disposed on an edge region of the lower redistribution substrate 300L, and upper test patterns PT2 may be disposed on an edge region of the upper redistribution substrate 300U.

The first semiconductor chip 100 may be provided on the lower redistribution substrate 300L. When viewed in plan, the first semiconductor chip 100 may be disposed on a chip region of the lower redistribution substrate 300L. The first semiconductor chip 100 may have a plurality of chip pads 111 on a bottom surface thereof. The first semiconductor chip 100 may be disposed to allow its bottom surface to face a top surface of the lower redistribution substrate 300L, and the chip pads 111 of the first semiconductor chip 100 may be connected to the lower redistribution patterns RDL1 of the lower redistribution substrate 300L. First connection terminals 150 may be attached between the chip pads 111 of the first semiconductor chip 100 and the lower redistribution patterns RDL1 of the lower redistribution substrate 300L.

The metal pillars 360 may be disposed around the first semiconductor chip 100, and may electrically connect the lower redistribution substrate 300L to the upper redistribution substrate 300U. The metal pillars 360 may penetrate the molding layer 370, and may have their top surfaces coplanar with that of the molding layer 370. The metal pillars 360 may have their bottom surfaces in direct contact with the lower redistribution patterns RDL1 of the lower redistribution substrate 300L.

The molding layer 370 may be provided between the lower and upper redistribution substrates 300L and 300U, and may cover the first semiconductor chip 100. The molding layer 370 may be provided on the top surface of the lower redistribution substrate 300L, and may cover a sidewall and a top surface of the first semiconductor chip 100. The molding layer 370 may fill gaps between the metal pillars 360, and may have a thickness substantially the same as or greater than a length of each of the metal pillars 360. The molding layer 370 may include a dielectric polymer, such as an epoxy-based molding compound.

The second semiconductor package 1000b may be disposed on the upper redistribution substrate 300U. The second semiconductor package 1000b may include a package substrate 710, a second semiconductor chip 200, and an upper molding layer 730. The package substrate 710 may be a printed circuit board. One or more metal pads 705 may be disposed on a bottom surface of the package substrate 710.

The second semiconductor chip 200 may be disposed on the package substrate 710. The second semiconductor chip 200 may include integrated circuits, and the integrated circuits may include a memory circuit, a logic circuit, or a combination thereof. The second semiconductor chip 200 may include chip pads 221 electrically connected to the metal pads 705 through wiring lines 715 provided in the package substrate 710. The package substrate 710 may be provided thereon with the upper molding layer 730 that covers the second semiconductor chip 200. The upper molding layer 730 may include a dielectric polymer, such as an epoxy-based polymer.

Connection terminals 750 may be provided between the metal pads 705 of the package substrate 710 and pads of upper redistribution patterns RDL2 of the upper redistribution substrate 300U.

In some embodiments, the upper redistribution substrate 300U may be omitted from the semiconductor package shown in FIG. 15, and the connection terminals 750 may be provided between the metal pillars 360 and the metal pads 705 of the package substrate 710. For example, the connection terminals 750 may be attached to the metal pillars 360.

Referring to FIG. 16, a semiconductor package according to the present embodiment may include a lower redistribution substrate 300L, an upper redistribution substrate 300U, a first semiconductor chip 100, metal pillars 360, a molding layer 370, and a second semiconductor chip 200.

The lower redistribution substrate 300L, the upper redistribution substrate 300U, the first semiconductor chip 100, the metal pillars 360, and the molding layer 370 may be substantially the same as those of the first semiconductor package 1000a discussed with reference to FIG. 15.

According to the present embodiment, the second semiconductor chip 200 may have a bottom surface in direct contact with an uppermost dielectric layer of the upper redistribution substrate 300U, and may include chip pads 221 in direct contact with redistribution pads of the upper redistribution substrate 300U. The chip pads 221 of the second semiconductor chip 200 may correspond to the redistribution pads of the upper redistribution substrate 300U, and may have their sizes and arrangement substantially the same as those of the redistribution pads of the upper redistribution substrate 300U. The chip pads 221 of the second semiconductor chip 200 may include metal, such as copper (Cu), nickel (Ni), cobalt (Co), tungsten (W), titanium (Ti), tin (Sn), or any alloy thereof.

Referring to FIG. 17, a semiconductor package according to the present embodiment may include a first semiconductor package 1000a and a second semiconductor package 1000b disposed on the first semiconductor package 1000a.

The first semiconductor package 1000a may include a redistribution substrate 300, a connection substrate 400 on the redistribution substrate 300, a first semiconductor chip 100, and a molding layer 450.

The redistribution substrate 300 may include, as discussed above with reference to FIGS. 5 to 9A, first to fourth redistribution layers, each of which may include redistribution patterns RDL, and the first and third redistribution layers may include their redistribution test patterns PT.

The connection substrate 400 may have an opening that exposes a top surface of the redistribution substrate 300, and the first semiconductor chip 100 may be disposed in the opening of the connection substrate 400. The connection substrate 400 may be provided before or after the first semiconductor chip 100 is provided. For example, a hole may be formed in a printed circuit board, and the printed circuit board having the hole may be used as the connection substrate 400. When viewed in plan, the first semiconductor chip 100 may be disposed on a central region of the redistribution substrate 300.

The connection substrate 400 may include base layers 410 and conductive structures 420. The base layers 410 may include a dielectric material. For example, the base layers 410 may include a carbon-based material, a ceramic, or a polymer. The conductive structure 420 may include wiring patterns and a wiring via that connects the wiring patterns. The conductive structures 420 of the connection substrate 400 may be connected pads of the redistribution substrate 300. The conductive structure 420 may include metal. The conductive structure 420 may include, for example, at least one selected from copper, aluminum, gold, lead, stainless steels, silver, iron, and any alloy thereof.

The molding layer 450 may be formed on the first semiconductor chip 100 and the connection substrate 400. The molding layer 450 may extend into and fill a gap between the first semiconductor chip 100 and the connection substrate 400. The molding layer 450 may include a dielectric polymer, such as an epoxy-based polymer. The molding layer 450 may partially expose the conductive structures 420 of the connection substrate 400.

The second semiconductor package 1000b may include a package substrate 710, a second semiconductor chip 200, and an upper molding layer 730. The package substrate 710 may be a printed circuit board. Alternatively, the redistribution substrate 300 may be used as the package substrate 710. One or more metal pads 705 may be disposed on a bottom surface of the package substrate 710.

The second semiconductor chip 200 may be disposed on the package substrate 710. The second semiconductor chip 200 may include integrated circuits, and the integrated circuits may include a memory circuit, a logic circuit, or a combination thereof. The second semiconductor chip 200 may include chip pads 221 electrically connected to the metal pads 705 through wiring lines 715 provided in the package substrate 710. The package substrate 710 may be provided thereon with the upper molding layer 730 that covers the second semiconductor chip 200. The upper molding layer 730 may include a dielectric polymer, such as an epoxy-based polymer.

Connection terminals 750 may be provided in upper holes of the upper molding layer 730. The connection terminals 750 may be provided between the metal pads 705 of the package substrate 710 and the conductive structures 420 of the connection substrate 400.

According to some example embodiments of the present inventive concepts, redistribution test patterns may be formed together with redistribution patterns, and thus it may be possible to determine whether or not a redistribution substrate is defective before semiconductor chips are attached to the redistribution substrate. Accordingly, a semiconductor package including the redistribution substrate may increase in reliability and yield, and the semiconductor package may decrease in manufacturing cost.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor package, comprising:
   a redistribution substrate that includes a chip region and an edge region around the chip region;
   a semiconductor chip on the chip region of the redistribution substrate; and
   a plurality of connection terminals disposed between the redistribution substrate and the semiconductor chip,
   wherein the redistribution substrate includes:
      a plurality of dielectric layers that are vertically stacked;
      a plurality of redistribution patterns on the chip region and in each of the dielectric layers; and
      a redistribution test pattern on the edge region and at a level the same as a level of at least one of the redistribution patterns.

2. The semiconductor package of claim 1,
   wherein a sidewall of the redistribution test pattern is vertically aligned with sidewalls of the dielectric layers, and
   wherein the sidewall of the redistribution test pattern is laterally spaced apart from the connection terminals.

3. The semiconductor package of claim 1, wherein the redistribution test pattern is spaced apart from the redistribution patterns and extends from the chip region toward the edge region.

4. The semiconductor package of claim 1, wherein the redistribution test pattern does not vertically overlap the semiconductor chip.

5. The semiconductor package of claim 1, wherein the redistribution test pattern has a thickness the same as a thickness of the redistribution patterns.

6. The semiconductor package of claim 1, wherein the redistribution test pattern has a line-width the same as a line-width of the redistribution patterns.

7. The semiconductor package of claim 1, further comprising:

a molding layer on the redistribution substrate and covering the semiconductor chip,
wherein a sidewall of the redistribution substrate is vertically aligned with a sidewall of the molding layer.

8. The semiconductor package of claim 1,
wherein the redistribution patterns include a power redistribution pattern to which a power voltage or a ground voltage is applied, and
wherein the level of the redistribution test pattern is the same as a level of the power redistribution pattern.

9. The semiconductor package of claim 1, wherein the redistribution substrate further includes a test pad on the edge region and connected to the redistribution test pattern.

10. The semiconductor package of claim 9,
wherein the redistribution substrate further includes a dummy redistribution pattern on an edge of the chip region, and
wherein a horizontal distance between the test pad and the dummy redistribution pattern is in a range of about 25 µm to about 40 µm.

11. A semiconductor package, comprising:
a package substrate;
a redistribution substrate on the package substrate, the redistribution substrate having a chip region and an edge region around the chip region;
a first semiconductor chip on the chip region of the redistribution substrate;
a second semiconductor chip on the chip region of the redistribution substrate and spaced apart from the first semiconductor chip, the second semiconductor chip including a plurality of memory chips that are vertically stacked;
a molding layer on the redistribution substrate, the molding layer covering the first semiconductor chip and the second semiconductor chip;
a plurality of first connection terminals between the redistribution substrate and the first semiconductor chip and between the redistribution substrate and the second semiconductor chip;
a plurality of second connection terminals between the package substrate and the redistribution substrate; and
a thermal radiation structure on the package substrate, the thermal radiation structure covering the redistribution substrate, the first semiconductor chip, and the second semiconductor chip,
wherein the redistribution substrate includes:
a plurality of dielectric layers that are vertically stacked;
a plurality of first redistribution patterns on the chip region and in each of the dielectric layers,
wherein a second redistribution pattern on the edge region and in at least one of the dielectric layers, the second redistribution pattern having a sidewall vertically aligned with sidewalls of the dielectric layers, and
wherein the sidewall of the second redistribution test pattern is laterally spaced apart from the first connection terminals.

12. The semiconductor package of claim 11, wherein the sidewall of the second redistribution pattern is vertically aligned with a sidewall of the molding layer.

13. The semiconductor package of claim 11,
wherein the redistribution substrate further includes a test pad on the edge region and connected to the second redistribution pattern, and
wherein the test pad is covered with the dielectric layers of the redistribution substrate.

14. The semiconductor package of claim 11, wherein the second redistribution pattern has a thickness the same as a thickness of the first redistribution patterns.

15. The semiconductor package of claim 11, wherein the second redistribution pattern includes first and second sub-redistribution patterns that are spaced apart from the first and second semiconductor chips and are at edges on opposite sides of the chip region.

16. The semiconductor package of claim 11,
wherein the first redistribution patterns include a power redistribution pattern to which a power voltage or a ground voltage is applied, and
wherein the second redistribution pattern is at a level the same as a level of the power redistribution pattern.

17. The semiconductor package of claim 11,
wherein each of the first redistribution patterns includes:
a via part that penetrates a corresponding one of the dielectric layers; and
a line part on the corresponding one of the dielectric layers and connected to the via part, and
wherein the first connection terminals are in contact with portions of the line parts of the first redistribution patterns.

18. A method of fabricating a semiconductor package, the method comprising:
providing a carrier substrate that includes a plurality of chip regions and a scribe line region between the chip regions;
forming a redistribution substrate including a plurality of redistribution layers vertically stacked on the carrier substrate, each of the redistribution layers including a dielectric layer and a plurality of redistribution patterns;
mounting a semiconductor chip on the redistribution substrate;
forming a molding layer that covers the semiconductor chip; and
cutting the molding layer and the redistribution substrate along the scribe line region,
wherein at least one of the redistribution layers includes:
a plurality of redistribution test patterns on the chip region; and
a plurality of test pads connected to the redistribution test patterns and provided on the scribe line region, and
wherein forming the redistribution substrate includes performing a test process on at least one of the redistribution layers via the test pads, and
wherein the test process is performed before the semiconductor chip is mounted on the redistribution substrate.

19. The method of claim 18, wherein cutting the molding layer and the redistribution substrate includes separating the test pads from the redistribution test patterns.

20. The method of claim 18, wherein a test pad of the plurality of test pads has a horizontal width of about 50 µm and a vertical width of about 50 µm.

* * * * *